(12) United States Patent
Rubin et al.

(10) Patent No.: US 8,255,192 B2
(45) Date of Patent: Aug. 28, 2012

(54) ANALYTICAL MAP MODELS

(75) Inventors: Darryl E. Rubin, Duvall, WA (US); Vijay Mital, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 424 days.

(21) Appl. No.: 12/163,863

(22) Filed: Jun. 27, 2008

(65) Prior Publication Data

US 2009/0326872 A1    Dec. 31, 2009

(51) Int. Cl.
G06F 17/50    (2006.01)
G06G 7/48    (2006.01)
G09B 25/00    (2006.01)

(52) U.S. Cl. .................... 703/6; 703/1; 434/72

(58) Field of Classification Search .............. 703/6, 1; 434/72

See application file for complete search history.

(56) References Cited

U.S. PATENT DOCUMENTS

| | | | |
|---|---|---|---|
| 5,469,538 A | 11/1995 | Razdow | |
| 5,481,741 A | 1/1996 | McKaskle et al. | |
| 5,528,735 A | 6/1996 | Strasnick et al. | |
| 5,537,618 A | 7/1996 | Boulton et al. | |
| 5,555,354 A | 9/1996 | Strasnick et al. | |
| 5,818,737 A * | 10/1998 | Orr et al. ..................... | 703/6 |
| 5,874,955 A | 2/1999 | Rogowitz et al. | |
| 5,945,976 A | 8/1999 | Iwamura et al. | |
| 6,063,126 A | 5/2000 | Borduin | |
| 6,085,978 A | 7/2000 | Knowles et al. | |
| 6,175,954 B1 | 1/2001 | Nelson | |
| 6,189,012 B1 | 2/2001 | Mital | |
| 6,208,985 B1 | 3/2001 | Krehel | |
| 6,222,533 B1 | 4/2001 | Notani | |
| 6,260,035 B1 | 7/2001 | Horvitz | |
| 6,385,563 B1 | 5/2002 | Vora et al. | |
| 6,484,164 B1 | 11/2002 | Nikolovska | |
| 6,690,370 B2 | 2/2004 | Ellenby et al. | |
| 6,823,299 B1 | 11/2004 | Contreras et al. | |
| 6,836,270 B2 | 12/2004 | Du | |
| 6,842,175 B1 * | 1/2005 | Schmalstieg et al. ......... | 345/427 |
| 6,856,980 B2 | 2/2005 | Feldman | |
| 6,868,525 B1 | 3/2005 | Szabo | |

(Continued)

FOREIGN PATENT DOCUMENTS

EP    1069534 A2    1/2001
WO    WO 2007079131    7/2007

OTHER PUBLICATIONS

Unigraphics Solutions, "Solid Edge User's Guide Version 8", Chapters 1-7, 2000, 316 pages.*

(Continued)

*Primary Examiner* — Suzanne Lo
(74) *Attorney, Agent, or Firm* — Workman Nydegger

(57) ABSTRACT

Visual map items may each be constructed and placed in position using logic defined by a map view component corresponding to each visual item, where that logic may depend on one or more values populated into parameter(s) of the map view component. Some of those parameter values may correspond to known map model parameter values. Others, however, may have been solved for using a model that defines analytical relationships between the map model parameters. In one embodiment, which of the map model parameters are input variable, and which are output model variables, may not be predetermined. Accordingly, a solver might be prepared for multiple solve operation paths even using a single model. The map view composition process may be entirely data-driven, and may include a mechanism for canonicalizing input data, and binding canonicalized input data to the model parameters.

23 Claims, 16 Drawing Sheets

U.S. PATENT DOCUMENTS

| | | |
|---|---|---|
| 6,906,712 B2 | 6/2005 | Lee et al. |
| 6,912,515 B2 | 6/2005 | Jackson |
| 6,922,681 B2 | 7/2005 | Fromherz |
| 6,982,712 B2 | 1/2006 | Ohto |
| 7,039,569 B1 | 5/2006 | Haws et al. |
| 7,047,168 B2 | 5/2006 | Carballo |
| 7,055,107 B1 * | 5/2006 | Rappaport et al. ............ 715/848 |
| 7,089,220 B2 | 8/2006 | Fromherz |
| 7,089,221 B2 | 8/2006 | Fromherz |
| 7,139,764 B2 | 11/2006 | Lee |
| 7,165,105 B2 | 1/2007 | Reiner |
| 7,216,116 B1 | 5/2007 | Nilsson |
| 7,219,307 B2 | 5/2007 | Senay |
| 7,272,817 B1 | 9/2007 | Hinkle et al. |
| 7,334,222 B2 | 2/2008 | Keller |
| 7,365,311 B1 | 4/2008 | Cetto |
| 7,530,020 B2 | 5/2009 | Szabo |
| 7,574,659 B2 | 8/2009 | Szabo |
| 7,765,175 B2 | 7/2010 | Crandall |
| 2002/0010571 A1 | 1/2002 | Daniel, Jr. |
| 2002/0169658 A1 | 11/2002 | Adler |
| 2003/0144868 A1 | 7/2003 | MacIntyre |
| 2004/0015783 A1 | 1/2004 | Lennon |
| 2004/0075697 A1 | 4/2004 | Maudlin |
| 2004/0154000 A1 | 8/2004 | Kasravi |
| 2004/0246252 A1 | 12/2004 | Morrow |
| 2005/0035883 A1 | 2/2005 | Kameda et al. |
| 2005/0091584 A1 | 4/2005 | Bogdan |
| 2005/0108256 A1 | 5/2005 | Wakefield |
| 2005/0120021 A1 | 6/2005 | Tang |
| 2005/0131657 A1 | 6/2005 | Mei |
| 2005/0131659 A1 | 6/2005 | Mei et al. |
| 2005/0210054 A1 | 9/2005 | Harris |
| 2006/0020523 A1 | 1/2006 | Song |
| 2006/0106793 A1 | 5/2006 | Liang |
| 2006/0117067 A1 | 6/2006 | Wright |
| 2006/0117303 A1 | 6/2006 | Gizinski |
| 2006/0253245 A1 | 11/2006 | Cera et al. |
| 2006/0271581 A1 | 11/2006 | Sanjar |
| 2006/0288023 A1 | 12/2006 | Szabo |
| 2007/0005534 A1 | 1/2007 | Sabato |
| 2007/0011134 A1 | 1/2007 | Langseth et al. |
| 2007/0016873 A1 | 1/2007 | Lindsay |
| 2007/0033443 A1 | 2/2007 | Tillmann |
| 2007/0043694 A1 | 2/2007 | Sawafta |
| 2007/0141541 A1 | 6/2007 | Chan et al. |
| 2007/0156677 A1 | 7/2007 | Szabo |
| 2007/0168454 A1 | 7/2007 | Ben-Yehuda |
| 2007/0188494 A1 | 8/2007 | Agutter |
| 2007/0271207 A1 | 11/2007 | Copty |
| 2007/0277111 A1 | 11/2007 | Bennett |
| 2007/0282809 A1 | 12/2007 | Hoeber et al. |
| 2007/0294196 A1 | 12/2007 | Musuvathi |
| 2008/0059889 A1 | 3/2008 | Parker |
| 2008/0133505 A1 | 6/2008 | Bayley et al. |
| 2009/0322739 A1 | 12/2009 | Rubin |
| 2009/0322743 A1 | 12/2009 | Rubin |
| 2009/0326885 A1 | 12/2009 | Rubin |
| 2009/0327183 A1 | 12/2009 | Rubin |
| 2010/0131248 A1 | 5/2010 | Green |
| 2010/0131254 A1 | 5/2010 | Rubin |
| 2010/0131255 A1 | 5/2010 | Beckman |
| 2010/0131546 A1 | 5/2010 | Mital |

OTHER PUBLICATIONS

Brook, Russell. "Solid Edge Design Sensors (On the Edge Solid Edge Tutorial)", Apr. 1, 2008, 4 pages.*

Yahoo Answers, "How can I change the size of the object in Autocad", Feb. 14, 2008, 1 page, accessed at http://answers.yahoo.com/question.index?qid=20080214221402AASmjoB.*

Hanna, M. "2007 Flying Stars Analysis", 2007, 21 pages.*

Anthropomorphic Visualization: A New Approach for Depicting Participants in Online Spaces (4 pages) http://smg.media.mit.edu/papers/Perry/lb270-perry.PDF (Apr. 24-29, 2004).

Browsing Large Online Data Tables using Generalized Query Previews (24 pages) hcil.cs.umd.edu/trs/2001-13/2001-13.ps (Feb. 5, 2002).

SHriMP Views: An Interactive Environment for Information Visualization and Navigation (2 pages) http:sigchi.org/chi2003/docs/shrimp.pdf (Apr. 20-25, 2002).

"Tube Map: Evaluation of a Visual Metaphor for Interfunctional Communication of Complex Projects (8 pages)http://know-center.tugraz.at/previous/i-know04/papers/burkhard.pdf(Graz, Austria, Jun. 30-Jul. 2, 2004)".

"Visualizing Software Changes (17 pages) http://ieeexplore.ieee.org/iel5/32/21473/00995435.pdf?isnumber=21473&prod=STD&arnumber=995435&amumber=995435&arSt=396&ared=412&arAuthor=Eick%2C+S.G.%3B+Graves%2C+T.L.%3B+Karr%2C+A.F.%3B+Mockus%2C+A.%  3B+Schuster%2C+P. (IEEE Transactions on Software Engineering, vol. 28, No. 4, Apr. 2002)".

"System Structure Analysis: Clustering with Data Bindings (9 pages) http://ieeexplore.ieee.org/iel5/32/35878/01702084.pdf(IEEE Transactions on Software Engineering, vol. SE-11, No. 8, Aug. 1985)".

Andrian Marcus et al., "3D Representations for Software Visualization", 2003 http://www.cs.wayne.edu/~vip/publications/Marcus.SoftVis.2003.3DRepresentation.pdf (10 pages).

Matthew J. Pastizzo et al., "Multi-Dimensional Data Visualization", Last visited Dec 6, 2010 http://www.cs.albany.edu/~erbacher/publications/BSC303.pdf (7 pages).

Mei C. Chuah et al., "SDM: Selective Dynamic Manipulation of Visualizations", 1995, (10 pages) http://www.ri.cmu.edu/pub_files/pub1/chuah_mei_1995_1/chuah_mei_1995_1.pdf.

Stefano Levialdi et al., "Visual Metaphors for Database Exploration1", 1995 (13 pages) http://citeseer.ist.psu.edu/cache/papers/cs/5732/http:zSzzSzwww.darmstadt.gmd.dezSzoasyszSzprojectszSzvirgiliozSzvirgilio.pdf/levialdi95visual.pdf.

Solver Platform SDK—Solver Engines (4 pages), Last viewed Dec. 6, 2010 http://www.solver.com/sdkengines.htm.

Bartak, Roman, "Plug-in Architecture of Constraint Hierarchy Solvers 1" (1 page), 1997, http://citeseer.ist.psu.edu/cache/papers/cs/12565/http:zSzzSzkti.ms.mff.cuni.czzSz~bartakzSzhtmlzSz..zSzdownloadszSzPlugIn.pdf/bartak97plug.pdf.

Chitnis et al., "ExSched: Solving Constraint Satisfaction Problems with the Spreadsheet Paradigm" (11 pages), Last viewed on Dec. 6, 2010, http://arxiv.org/ftp/cs/papers/0701/0701109.pdf.

Visual Representations and Interaction Technologies, 2005 http://nvac.pnl.gov/docs/RD_Agenda_NVAC_chapter3.pdf (36 pages).

Aigner et al., "Introduction to Visual Analytics", 2007 http://www.donau-uni.ac.at/imperia/md/content/department/ike/ike_publications/2007/refereedconferenceandworkshoparticles/va-tutorial.pdf (4 pages).

U.S. Appl. No. 12/163,872, Nov. 12, 2010, Office Action.

U.S. Appl. No. 12/324,462, Jun. 9, 2011, Office Action.

Unigraphics Solutions, "Solid Edge User's Guide", Version 8, Copyright 2000.

"About SAGA GIS," SAGA, www.saga-gis.uni-goettingen.de/html/index.php (Aug. 1, 2008).

"GIS Modeling," Clark Labs, www.clarklabs.org/products/GIS-Modeling.cfm (2006).

"3D Landscape Design & Visualization Software," 3D Nature, http://3dnature.com/ (2008).

"ChemSite 3D Molecular Visualization Software," Chemistry Software, www.chemistry-software.com/modelling/10190.htm (Aug. 1, 2008).

Heer, Jeffrey, "Design Consideration for Collaborative Visual Analytics," Feb. 21, 2008.

Chi, Ed H., "A Taxonomy of Visualization Techniques using the Data State Reference Model," Xerox Palo Alto Research Center, 2000.

Tory, Melanie, "A Model-Based Visualization Taxonomy," School of Computing Science, Simon Fraser University, 2002.

Chen, Hong, "Towards Design Patterns for Dynamic Analytical Data Visualization," Analytical Solutions Division, SAS Institute Inc., 2004.

Rodrigues, Jose F., "Reviewing Data Visualization: an Analytical Taxonomical Study," University of Sao Paulo at Sao Carlos, Brazil, 2006, pp. 1-8.

Koehler, Jana, "The Role of Visual Modeling and Model Transformations in Business-driven Development," IBM Zurich Research Laboratory, Switzerland, 2006, pp. 1-12.

Bunus, Peter, "A Simulation and Decision Framework for Selection of Numerical Solvers in Scientific Computing," Linkoping University, Sweden, Aug. 2006.

"Maplesoft Enhances Math Software," Maplesoft, www.automation.com/content/maplesoft-enhances-math-software, Aug. 26, 2008.

"MATLAB," Research Services, Information Technology Services, www.bc.edu/offices/researchservices/software/Matlab.html, Mar. 2007.

"SchematicSolver," Mathematica Application, www.SchematicSolver.com, (accessed Aug. 26, 2008).

"TIBCO Spotfire DecisionSite Enterprise Analytics Product Suite," TIBCO Software Inc., http://spotfire.tibco.com/products/decisionsite.cfm, Aug. 26, 2008.

"Math Package Gives you Extensive Range of Symbolic and Numerical Capabilities," CNET Networks Inc, http://findarticles.com/p/articles/mi_hb4804/is_198907/ai_n17443817, Aug. 26, 2008.

Whiting, Mark A., "WebTheme: Understanding Web Information through Visual Analytics," Pacific Northwest National Laboratory, *Lecture Notes in Computer Science*, vol. 2342/2002, The Semantic Web—ISWC 2002, Jan. 1, 2002, pp. 460-468.

Sheth, Amit, "From Semantic Search & Integration to Analytics," Semagix Inc. and LSDIS lab, University of Georgia, Sep. 19-24, 2004, pp. 1-10.

Ricarte, Ivan L. M., "A Reference Software Model for Intelligent Information Search," School of Electrical and Computer Engineering, State University of Campinas, Sao Paulo, Brazil, 2004, pp. 1-20.

Yang, Di, "Analysis Guided Visual Exploration of Multivariate Data," Worcester Polytechnic Institute, Oct. 2007.

U.S. Appl. No. 12/163,867, May 3, 2011, Office Action.

U.S. Appl. No. 12/324,469, Feb. 22, 2011, Office Action.

Brook, Russell, "Supply Chain Collaboration (On the Edge Solid Edge Tutorial)", Jan. 1, 2007, 7 pages.

Unigraphics Solutions, "Solid Edge User's Guide Version 8", Chapters 8-10, Glossary, 2000, 82 pages.

U.S. Appl. No. 12/163,872, Mar. 1, 2011, Office Action.

Multi-Domain Physical System Modeling and Control Based on Meta-Modeling and Graph Rewriting Sagar Sen and Hans Venghuluwe Proceeding of the 2006 IEEE Conference on Computer Aided Control Systems Design (Munich, Germany, Oct. 4-6, 2006).

U.S. Appl. No. 12/324,480, Sep. 7, 2011, Office Action.

Brook, Russell, "Solid Edge's Goal Seek: The Next Best Thing to Hindsight (On the Edge Solid Edge Tutorial)", Oct. 1, 2007, 3 pages, accessed at http://www.cadalyst.com/manufacturing/solid-edge039s-goal-seek-the-next-best-thing-hindsight-on-edge-solid-edge-tutorial-111.

Shahar, Yuval et al., "Intelligent Visualization and Exploration of Time-Oriented Clinical Data"; 1999, IEEE, Proceedings of the 32nd Hawaii International Conference on System Sciences: pp. 1-12.

U.S. Appl. No. 12/163,872, Aug. 3, 2011, Office Action.

U.S. Appl. No. 12/324,451, Aug. 29, 2011, Notice of Allowance.

U.S. Appl. No. 12/324,462, Aug. 30, 2011, Notice of Allowance.

U.S. Appl. No. 12/163,957, Jul. 5, 2011, Office Action.

U.S. Appl. No. 12/324,469, Jul. 21, 2011, Office Action.

\* cited by examiner

ANALYTICAL MAP MODELS

BACKGROUND

Often, the most effective way to convey information to a human being is visually. Accordingly, millions of people work with a wide range of visual items in order to convey or receive information, and in order to collaborate. Such visual items might include, for example, concept sketches, engineering drawings, explosions of bills of materials, three-dimensional models depicting various structures such as buildings or molecular structures, training materials, illustrated installation instructions, planning diagrams, and so on.

More recently, these visual items are constructed electronically using, for example, Computer Aided Design (CAD) and solid modeling applications. Often these applications allow authors to attach data and constraints to the geometry. For instance, the application for constructing a bill of materials might allow for attributes such as part number and supplier to be associated with each part, the maximum angle between two components, or the like. An application that constructs an electronic version of an arena might have a tool for specifying a minimum clearance between seats, and so on.

Such applications have contributed enormously to the advancement of design and technology. However, any given application does have limits on the type of information that can be visually conveyed, how that information is visually conveyed, or the scope of data and behavior that can be attributed to the various visual representations. If the application is to be modified to go beyond these limits, a new application would typically be authored by a computer programmer which expands the capabilities of the application, or provides an entirely new application. Also, there are limits to how much a user (other than the actual author of the model) can manipulate the model to test various scenarios.

BRIEF SUMMARY

Embodiments described herein relate to the construction of a map view that contains multiple visual map items. The visual map items may each be constructed and placed in position using logic defined by a map view component corresponding to each visual map item, where that logic may depend on one or more values populated into parameter(s) of the map view component. Some of those parameter values may correspond to known model parameter values. Others, however, may have been solved for using a model that defines analytical relationships between the map model parameters. In one embodiment, which of the map model parameters are known, and which are unknown, may not be predetermined. Accordingly, a solver might be prepared for multiple solve operation paths even using a single model. The map view composition process may be entirely data-driven, and may include a mechanism for canonicalizing input data, and binding canonicalized input data to the map model parameters.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which:

FIG. 12 illustrates a visualization of a shelf layout and represents just one of countless applications that the principles described herein may apply to;

FIG. 13 illustrates a visualization of an urban plan that the principles described herein may also apply to;

DETAILED DESCRIPTION

Figure 1:
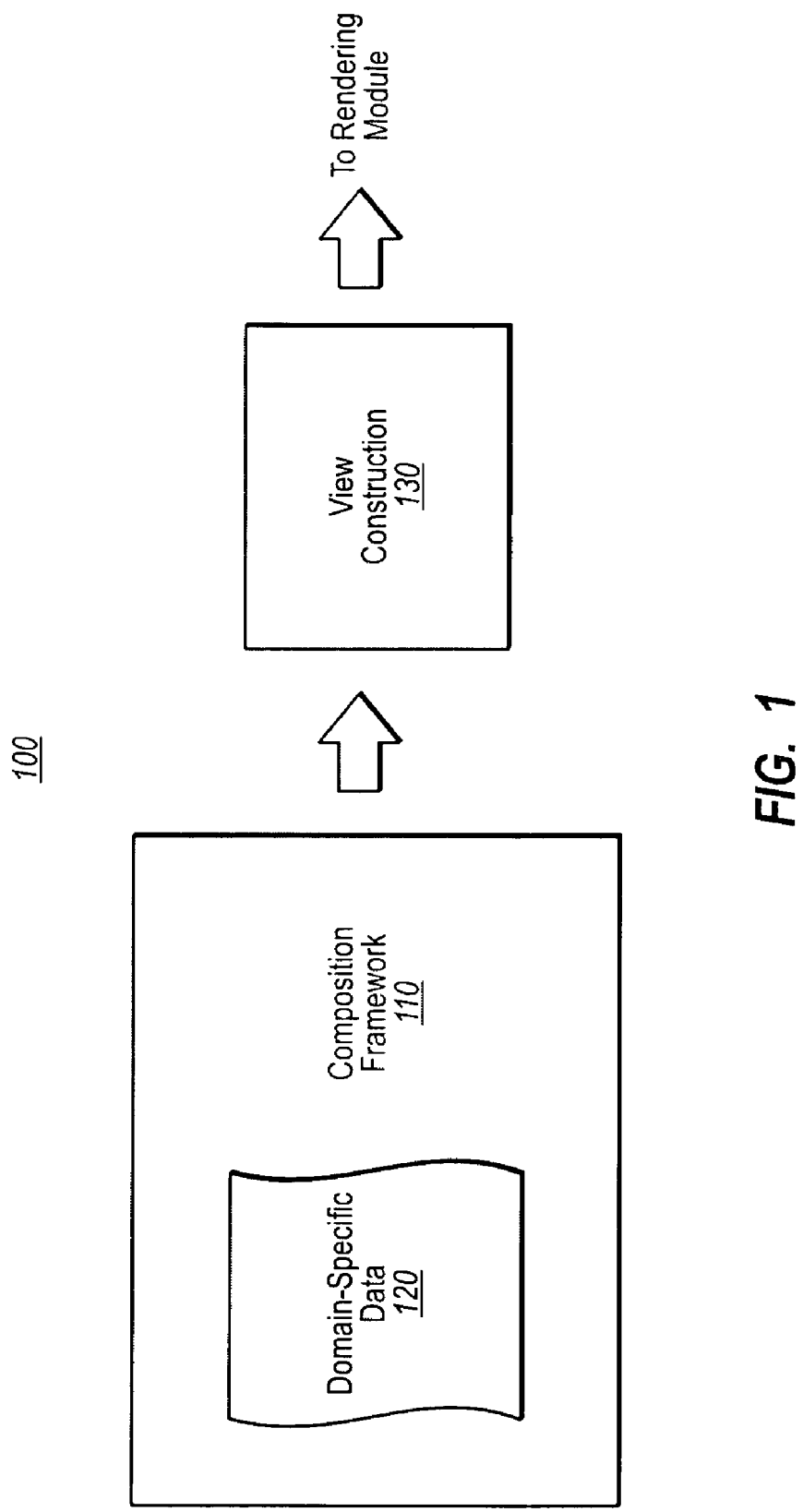
FIG. 1 illustrates an environment in which the principles of the present invention may be employed including a data-driven composition framework that constructs a view composition that depends on input data.

FIG. 1 illustrates a visual composition environment 100 that may be used to construct an interactive visual composition. The construction of the interactive visual composition is performed using data-driven analytics and visualization of the analytical results. The environment 100 includes a composition framework 110 that performs logic that is performed independent of the problem-domain of the view composition 130. For instance, the same composition framework 110 may be used to compose interactive view compositions for city plans, molecular models, grocery shelf layouts, machine performance or assembly analysis, or other domain-specific renderings.

The composition framework 110 uses domain-specific data 120, however, to construct the actual visual composition 130 that is specific to the domain. Accordingly, the same composition framework 110 may be used to construction view compositions for any number of different domains by changing the domain-specific data 120, rather than having to recode the composition framework 110 itself. Thus, the composition framework 110 of the pipeline 100 may apply to a potentially unlimited number of problem domains, or at least to a wide variety of problem domains, by altering data, rather than recoding and recompiling. The view composition 130 may then be supplied as instructions to an appropriate 2-D or 3-D rendering module. The architecture described herein also allows for convenient as incorporation of pre-existing view composition models as building blocks to new view composition models. In one embodiment, multiple view compositions may be included in an integrated view composition to allow for easy comparison between two possible solutions to a model.

Figure 2:
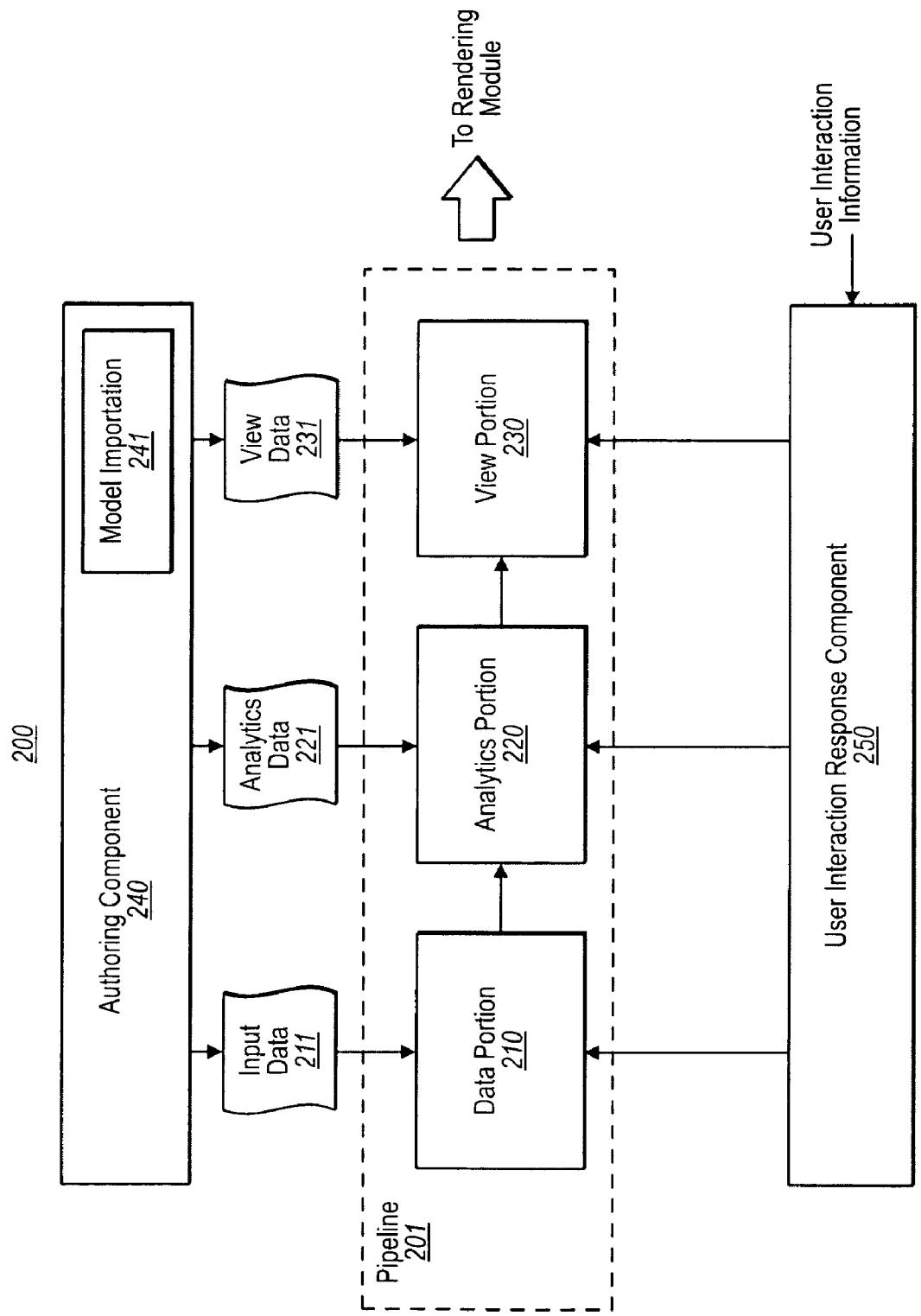
FIG. 2 illustrates a pipeline environment that represents one example of the environment of FIG. 1.

FIG. 2 illustrates an example architecture of the composition framework 110 in the form of a pipeline environment 200. The pipeline environment 200 includes, amongst other things, the pipeline 201 itself. The pipeline 201 includes a data portion 210, an analytics portion 220, and a view portion 230, which will each be described in detail with respect to subsequent FIGS. 3 through 5, respectively, and the accompanying description. For now, at a general level, the data portion 210 of the pipeline 201 may accept a variety of different types of data and presents that data in a canonical form to the analytics portion 220 of the pipeline 201. The analytics portion 220 binds the data to various model parameters, and solves for the unknowns in the model parameters using model analytics. The various parameter values are then provided to the view portion 230, which constructs the composite view using those values if the model parameters.

The pipeline environment 200 also includes an authoring component 240 that allows an author or other user of the pipeline 201 to formulate and/or select data to provide to the pipeline 201. For instance, the authoring component 240 may be used to supply data to each of data portion 210 (represented by input data 211), analytics portion 220 (represented by analytics data 221), and view portion 230 (represented by view data 231). The various data 211, 221 and 231 represent an example of the domain-specific data 120 of FIG. 1, and will be described in much further detail hereinafter. The authoring component 240 supports the providing of a wide variety of data including for example, data schemas, actual data to be used by the model, the location or range of possible locations of data that is to be brought in from external sources, visual (graphical or animation) objects, user interface interactions that can be performed on a visual, modeling statements (e.g., views, equations, constraints), bindings, and so forth. In one embodiment, the authoring component is but one portion of the functionality provided by an overall manager component (not shown in FIG. 2, but represented by the composition framework 110 of FIG. 1). The manager is an overall director that controls and sequences the operation of all the other components (such as data connectors, solvers, viewers, and so forth) in response to events (such as user interaction events, external data events, and events from any of the other components such as the solvers, the operating system, and so forth).

Traditionally, the lifecycle of an interactive view composition application involves two key times: authoring time, and use time. At authoring time, the functionality of the interactive view composition application is coded by a programmer to provide an interactive view composition that is specific to the desired domain. For instance, the author of an interior design application (e.g., typically, a computer programmer) might code an application that permits a user to perform a finite set of actions specific to interior designing.

At use time, a user (e.g., perhaps a home owner or a professional interior designer) might then use the application to perform any one or more of the set of finite actions that are hard coded into the application. In the interior design application example, the user might specify the dimensions of a virtual room being displayed, add furniture and other interior design components to the room, perhaps rotate the view to get various angles on the room, set the color of each item, and so forth. However, unless the user is a programmer that does not mind reverse-engineering and modifying the interior design application, the user is limited to the finite set of actions that were enabled by the application author. For example, unless offered by the application, the user would not be able to use the application to automatically figure out which window placement would minimize ambient noise, how the room layout performs according to Feng Shui rules, or minimize solar heat contribution.

However, in the pipeline environment 200 of FIG. 2, the authoring component 240 is used to provide data to an existing pipeline 201, where it is the data that drives the entire process from defining the input data, to defining the analytical model, to defining how the results of the analytics are visualized in the view composition. Accordingly, one need not perform any coding in order to adapt the pipeline 201 to any one of a wide variety of domains and problems. Only the data provided to the pipeline 201 is what is to change in order to apply the pipeline 201 to visualize a different view composition either from a different problem domain altogether, or to perhaps adjust the problem solving for an existing domain. Further, since the data can be changed at use time (i.e., run time), as well as at author time, the model can be modified and/or extended at runtime. Thus, there is less, if any, distinction between authoring a model and running the model. Because all authoring involves editing data items and because the software runs all of its behavior from data, every change to data immediately affects behavior without the need for recoding and recompilation.

The pipeline environment 200 also includes a user interaction response module 250 that detects when a user has interacted with the displayed view composition, and then determines what to do in response. For example, some types of interactions might require no change in the data provided to the pipeline 201 and thus require no change to the view composition. Other types of interactions may change one or more of the data 211, 221, or 231. In that case, this new or modified data may cause new input data to be provided to the data portion 210, might require a reanalysis of the input data by the analytics portion 220, and/or might require a re-visualization of the view composition by the view portion 230.

Accordingly, the pipeline 201 may be used to extend data-driven analytical visualizations to perhaps an unlimited number of problem domains, or at least to a wide variety of problem domains. Furthermore, one need not be a programmer to alter the view composition to address a wide variety of problems. Each of the data portion 210, the analytics portion 220 and the view portion 230 of the pipeline 201 will now be described with respect to respective data portion 300 of FIG. 3, the analytics portion 400 of FIG. 4, and the view portion 500 of FIG. 5, in that order. As will be apparent from FIGS. 3 through 5, the pipeline 201 may be constructed as a series of transformation component where they each 1) receive some appropriate input data, 2) perform some action in response to that input data (such as performing a transformation on the input data), and 3) output data which then serves as input data to the next transformation component.

The pipeline 201 may be implemented on the client, on the server, or may even be distributed amongst the client and the server without restriction. For instance, the pipeline 201 might be implemented on the server and provide rendering instructions as output. A browser at the client-side may then just render according to the rendering instructions received from the server. At the other end of the spectrum, the pipeline 201 may be contained on the client with authoring and/or use performed at the client. Even if the pipeline 201 was entirely at the client, the pipeline 201 might still search data sources external to the client for appropriate information (e.g., models, connectors, canonicalizers, schemas, and others). There are also embodiments that provide a hybrid of these two approaches. For example, in one such hybrid approach, the model is hosted on a server but web browser modules are dynamically loaded on the client so that some of the model's interaction and viewing logic is made to run on the client (thus allowing richer and faster interactions and views).

Figure 3:
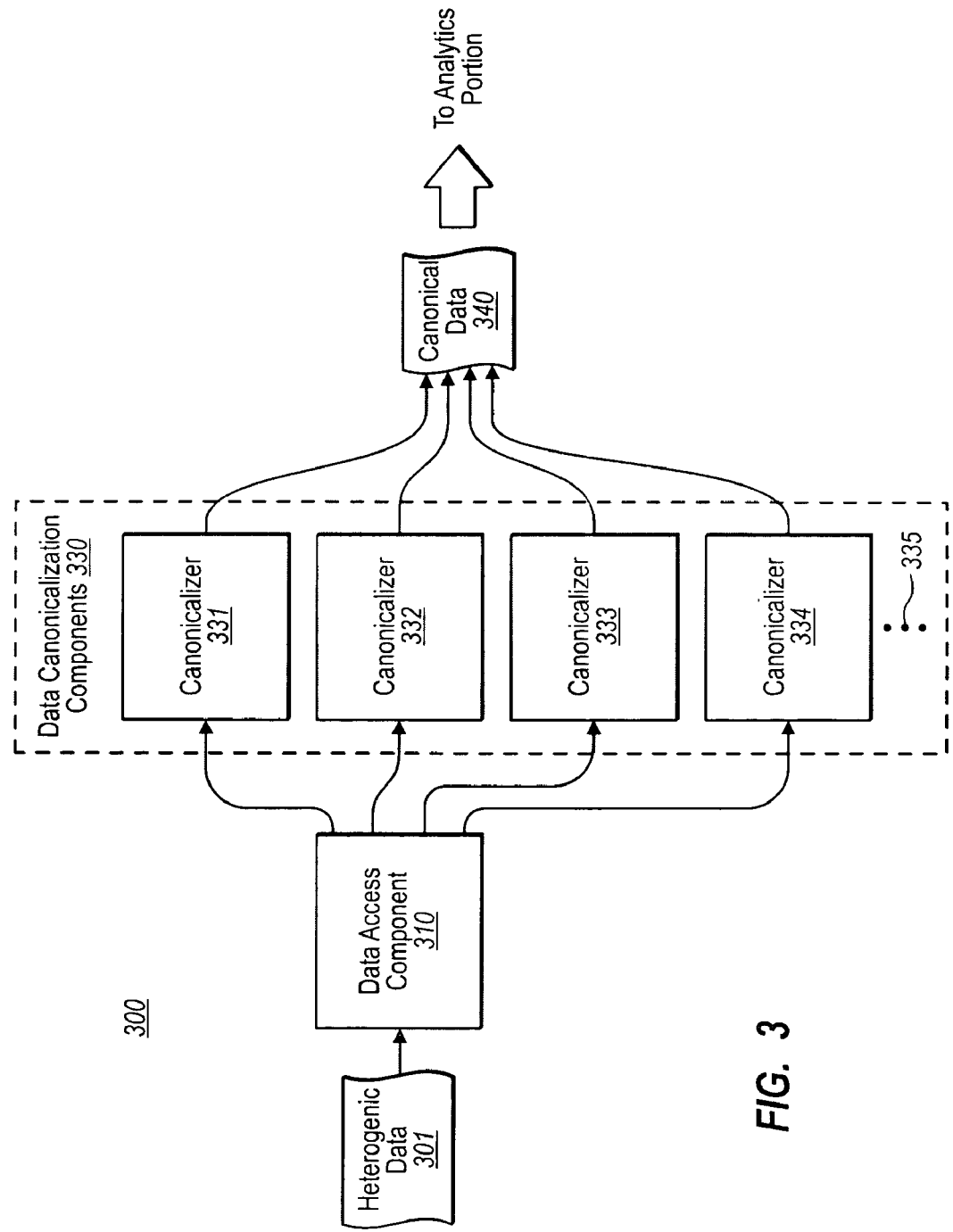
FIG. 3 schematically illustrates an embodiment of the data portion of the pipeline of FIG. 2.

FIG. 3 illustrates just one of many possible embodiments of a data portion 300 of the pipeline 201 of FIG. 2. One of the functions of the data portion 300 is to provide data in a canonical format that is consistent with schemas understood by the analytics portion 400 of the pipeline discussed with respect to FIG. 4. The data portion includes a data access component 310 that accesses the heterogenic data 301. The input data 301 may be "heterogenic" in the sense that the data may (but need not) be presented to the data access component 310 in a canonical form. In fact, the data portion 300 is structured such that the heterogenic data could be of a wide variety of formats. Examples of different kinds of domain data that can be accessed and operated on by models include text and XML documents, tables, lists, hierarchies (trees), SQL database query results, BI (business intelligence) cube query results, graphical information such as 2D drawings and 3D visual models in various formats, and combinations thereof (i.e, a composite). Further, the kind of data that can be accessed can be extended declaratively, by providing a definition (e.g., a schema) for the data to be accessed. Accordingly, the data portion 300 permits a wide variety of heterogenic input into the model, and also supports runtime, declarative extension of accessible data types.

In one embodiment, the data access portion 300 includes a number of connectors for obtaining data from a number of different data sources. Since one of the primary functions of the connector is to place corresponding data into canonical form, such connectors will often be referred to hereinafter and in the drawings as "canonicalizers". Each canonicalizer might have an understanding of the specific Application Program Interfaces (API's) of its corresponding data source. The canonicalizer might also include the corresponding logic for interfacing with that corresponding API to read and/or write data from and to the data source. Thus, canonicalizers bridge between external data sources and the memory image of the data.

The data access component 310 evaluates the input data 301. If the input data is already canonical and thus processable by the analytics portion 400, then the input data may be directly provided as canonical data 340 to be input to the analytics portion 400.

However, if the input data 301 is not canonical, then the appropriate data canonicalization component 330 is able to convert the input data 301 into the canonical format. The data canonicalization components 330 are actually a collection of data canonicalization components 330, each capable of converting input data having particular characteristics into canonical form. The collection of canonicalization components 330 is illustrated as including four canonicalization components 331, 332, 333 and 334. However, the ellipses 335 represents that there may be other numbers of canonicalization components as well, perhaps even fewer that the four illustrated.

The input data 301 may even include a canonicalizer itself as well as an identification of correlated data characteristic(s). The data portion 300 may then register the correlated data characteristics, and provide the canonicalization component to the data canonicalization component collection 330, where it may be added to the available canonicalization components. If input data is later received that has those correlated characteristics, the data portion 310 may then assign the input data to the correlated canonicalization component. Canonicalization components can also be found dynamically from external sources, such as from defined component libraries on the web. For example, if the schema for a given data source is known but the needed canonicalizer is not present, the canonicalizer can be located from an external component library, provided such a library can be found and contains the needed components. The pipeline might also parse data for which no schema is yet known and compare parse results versus schema information in known component libraries to attempt a dynamic determination of the type of the data, and thus to locate the needed canonicalizer components.

Alternatively, instead of the input data including all of the canonicalization component, the input data may instead provide a transformation definition defining canonicalization transformations. The collection 330 may then be configured to convert that transformations definition into a corresponding canonicalization component that enforces the transformations along with zero or more standard default canonicalization transformation. This represents an example of a case in which the data portion 300 consumes the input data and does not provide corresponding canonicalized data further down the pipeline. In perhaps most cases, however, the input data 301 results in corresponding canonicalized data 340 being generated.

In one embodiment, the data portion 310 may be configured to assign input data to the data canonicalization component on the basis of a file type and/or format type of the input data. Other characteristics might include, for example, a source of the input data. A default canonicalization component may be assigned to input data that does not have a designated corresponding canonicalization component. The default canonicalization component may apply a set of rules to attempt to canonicalize the input data. If the default canonicalization component is not able to canonicalize the data, the default canonicalization component might trigger the authoring component 140 of FIG. 1 to prompt the user to provide a schema definition for the input data. If a schema definition does not already exist, the authoring component 140 might present a schema definition assistant to help the author generate a corresponding schema definition that may be used to transform the input data into canonical form. Once the data is in canonical form, the schema that accompanies the data provides sufficient description of the data that the rest of the pipeline 201 does not need new code to interpret the data. Instead, the pipeline 201 includes code that is able to interpret data in light of any schema that is expressible an accessible schema declaration language.

Regardless, canonical data 340 is provided as output data from the data portion 300 and as input data to the analytics portion 400. The canonical data might include fields that include a variety of data types. For instance, the fields might includes simple data types such as integers, floating point numbers, strings, vectors, arrays, collections, hierarchical structures, text, XML documents, tables, lists, SQL database query results, BI (business intelligence) cube query results, graphical information such as 2D drawings and 3D visual models in various formats, or even complex combinations of these various data types. As another advantage, the canonicalization process is able to canonicalize a wide variety of input data. Furthermore, the variety of input data that the data portion 300 is able to accept is expandable. This is helpful in the case where multiple models are combined as will be discussed later in this description.

Figure 4:
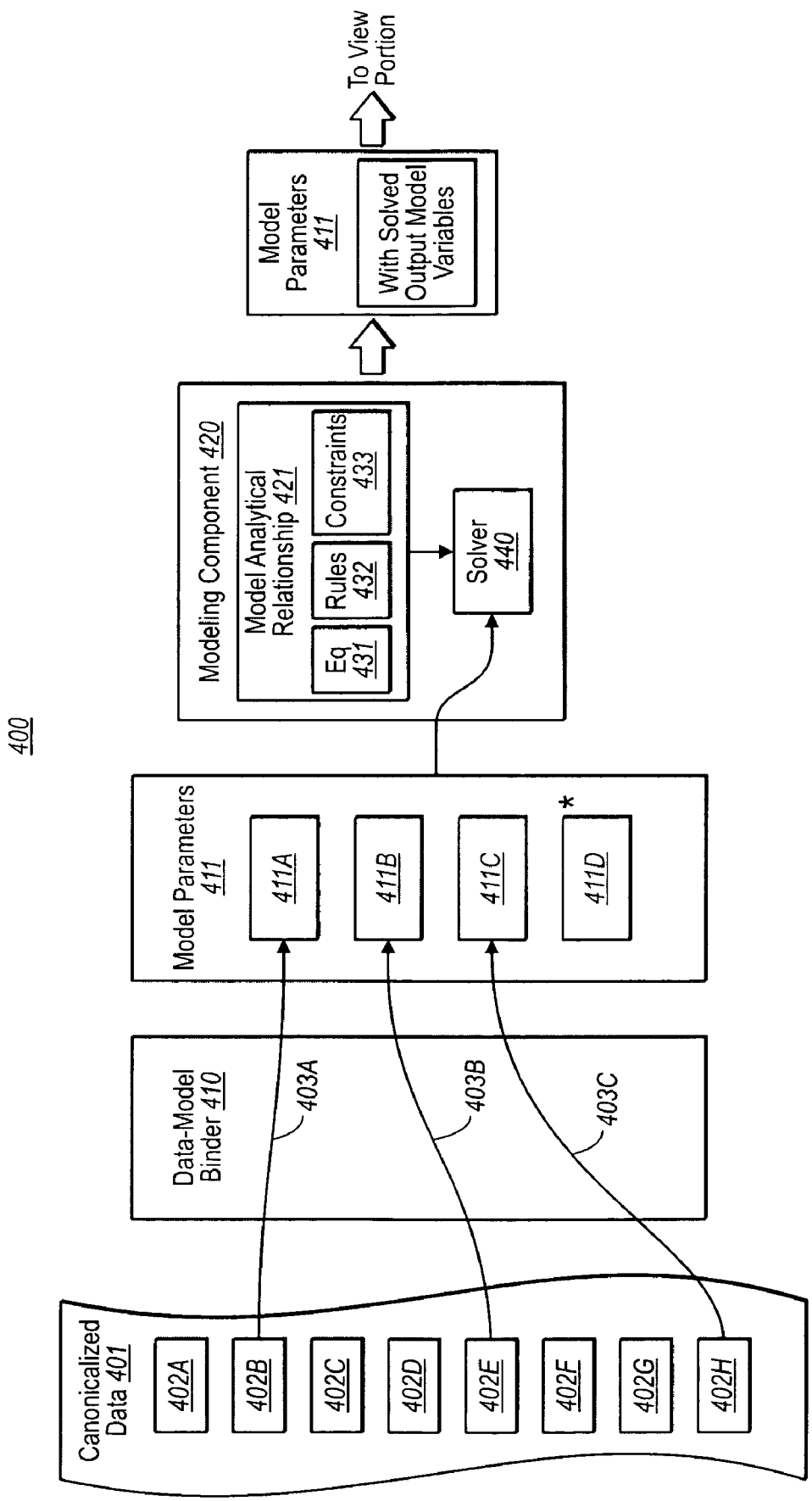
FIG. 4 schematically illustrates an embodiment of the analytics portion of the pipeline of FIG. 2.

FIG. 4 illustrates analytics portion 400 which represents an example of the analytics portion 220 of the pipeline 201 of FIG. 2. The data portion 300 provided the canonicalized data 401 to the data-model binding component 410. While the canonicalized data 401 might have any canonicalized form, and any number of parameters, where the form and number of parameters might even differ from one piece of input data to another. For purposes of discussion, however, the canonical data 401 has fields 402A through 402H, which may collectively be referred to herein as "fields 402".

On the other hand, the analytics portion 400 includes a number of model parameters 411. The type and number of model parameters may differ according to the model. However, for purposes of discussion of a particular example, the model parameters 411 will be discussed as including model parameters 411A, 411B, 411C and 411D. In one embodiment, the identity of the model parameters, and the analytical relationships between the model parameters may be declaratively defined without using imperative coding.

A data-model binding component 410 intercedes between the canonicalized data fields 402 and the model parameters 411 to thereby provide bindings between the fields. In this case, the data field 402B is bound to model parameter 411A as represented by arrow 403A. In other words, the value from data field 402B is used to populate the model parameter 411A. Also, in this example, the data field 402E is bound to model parameter 411B (as represented by arrow 403B), and data field 402H is bound to model parameter 411C (as represented by arrow 403C).

The data fields 402A, 402C, 402D, 402F and 402G are not shown bound to any of the model parameters. This is to emphasize that not all of the data fields from input data are always required to be used as model parameters. In one embodiment, one or more of these data fields may be used to provide instructions to the data-model binding component 410 on which fields from the canonicalized data (for this canonicalized data or perhaps any future similar canonicalized data) are to be bound to which model parameter. This represents an example of the kind of analytics data 221 that may be provided to the analytics portion 220 of FIG. 2. The definition of which data fields from the canonicalized data are bound to which model parameters may be formulated in a number of ways. For instance, the bindings may be 1) explicitly set by the author at authoring time, 2) explicit set by the user at use time (subject to any restrictions imposed by the author), 3) automatic binding by the authoring component 240 based on algorithmic heuristics, and/or 4) prompting by the authoring component of the author and/or user to specify a binding when it is determined that a binding cannot be made algorithmically. Thus bindings may also be resolved as part of the model logic itself.

The ability of an author to define which data fields are mapped to which model parameters gives the author great flexibility in being able to use symbols that the author is comfortable with to define model parameters. For instance, if one of the model parameters represents pressure, the author can name that model parameter "Pressure" or "P" or any other symbol that makes sense to the author. The author can even rename the model parameter which, in one embodiment, might cause the data model binding component 410 to automatically update to allow bindings that were previously to the model parameter of the old name to instead be bound to the model parameter of the new name, thereby preserving the desired bindings. This mechanism for binding also allows binding to be changed declaratively at runtime.

The model parameter 411D is illustrated with an asterisk to emphasize that in this example, the model parameter 411D was not assigned a value by the data-model binding component 410. Accordingly, the model parameter 411D remains an unknown. In other words, the model parameter 411D is not assigned a value.

The modeling component 420 performs a number of functions. First, the modeling component 420 defines analytical relationships 421 between the model parameters 411. The analytical relationships 421 are categorized into three general categories including equations 431, rules 432 and constraints 433. However, the list of solvers is extensible. In one embodiment, for example, one or more simulations may be incorporated as part of the analytical relationships provided a corresponding simulation engine is provided and registered as a solver.

The term "equation" as used herein aligns with the term as it is used in the field of mathematics.

The term "rules" as used herein means a conditional statement where if one or more conditions are satisfied (the conditional or "if" portion of the conditional statement), then one or more actions are to be taken (the consequence or "then" portion of the conditional statement). A rule is applied to the model parameters if one or more model parameters are expressed in the conditional statement, or one or more model parameters are expressed in the consequence statement.

The term "constraint" as used herein means that a restriction is applied to one or more model parameters. For instance, in a city planning model, a particular house element may be restricted to placement on a map location that has a subset of the total possible zoning designations. A bridge element may be restricted to below a certain maximum length, or a certain number of lanes.

An author that is familiar with the model may provide expressions of these equations, rules and constraint that apply to that model. In the case of simulations, the author might provide an appropriate simulation engine that provides the appropriate simulation relationships between model parameters. The modeling component 420 may provide a mechanism for the author to provide a natural symbolic expression for equations, rules and constraints. For example, an author of a thermodynamics related model may simply copy and paste equations from a thermodynamics textbook. The ability to bind model parameters to data fields allows the author to use whatever symbols the author is familiar with (such as the exact symbols used in the author's relied-upon textbooks) or the exact symbols that the author would like to use.

Prior to solving, the modeling component 420 also identifies which of the model parameters are to be solved for (i.e., hereinafter, the "output model variable" if singular, or "output model variables" if plural, or "output model variable(s)" if there could be a single or plural output model variables). The output model variables may be unknown parameters, or they might be known model parameters, where the value of the known model parameter is subject to change in the solve operation. In the example of FIG. 4, after the data-model binding operation, model parameters 411A, 411B and 411C are known, and model parameter 411D is unknown. Accordingly, unknown model parameter 411D might be one of the output model variables. Alternatively or in addition, one or more of the known model parameters 411A, 411B and 411C might also be output model variables. The solver 440 then solves for the output model variable(s), if possible. In one embodiment described hereinafter, the solver 440 is able to solve for a variety of output model variables, even within a single model so long as sufficient input model variables are provided to allow the solve operation to be performed. Input model variables might be, for example, known model parameters whose values are not subject to change during the solve operation. For instance, in FIG. 4, if the model parameters 411A and 411D were input model variables, the solver might instead solve for output model variables 411B and 411C instead. In one embodiment, the solver might output any one of a number of different data types for a single model parameter. For instance, some equation operations (such as addition, subtraction, and the like) apply regardless of the whether the operands are integers, floating point, vectors of the same, or matrices of the same.

In one embodiment, even when the solver 440 cannot solve for a particular output model variables, the solver 400 might still present a partial solution for that output model variable, even if a full solve to the actual numerical result (or whatever the solved-for data type) is not possible. This allows the pipeline to facilitate incremental development by prompting the author as to what information is needed to arrive at a full solve. This also helps to eliminate the distinction between author time and use time, since at least a partial solve is available throughout the various authoring stages. For an abstract example, suppose that the analytics model includes an equation a=b+c+d. Now suppose that a, c and d are output model variables, and b is an input model variable having a known value of 5 (an integer in this case). In the solving process, the solver 440 is only able to solve for one of the output model variables "d", and assign a value of 6 (an integer) to the model parameter called "d", but the solver 440 is not able to solve for "c". Since "a" depends from "c", the model parameter called "a" also remains an unknown and unsolved for. In this case, instead of assigning an integer value to "a", the solver might do a partial solve and output the string value of "c+11" to the model parameter "a". As previously mentioned, this might be especially helpful when a domain expert is authoring an analytics model, and will essential serve to provide partial information regarding the content of model parameter "a" and will also serve to cue the author that some further model analytics needs to be provided that allow for the "c" model parameter to be solved for. This partial solve result may be perhaps output in some fashion in the view composition to allow the domain expert to see the partial result.

The solver 440 is shown in simplified form in FIG. 4. However, the solver 440 may direct the operation of multiple constituent solvers as will be described with respect to FIG. 9. In FIG. 4, the modeling component 420 then makes the model parameters (including the now known and solved-for output model variables) available as output to be provided to the view portion 500 of FIG. 5.

Figure 5:
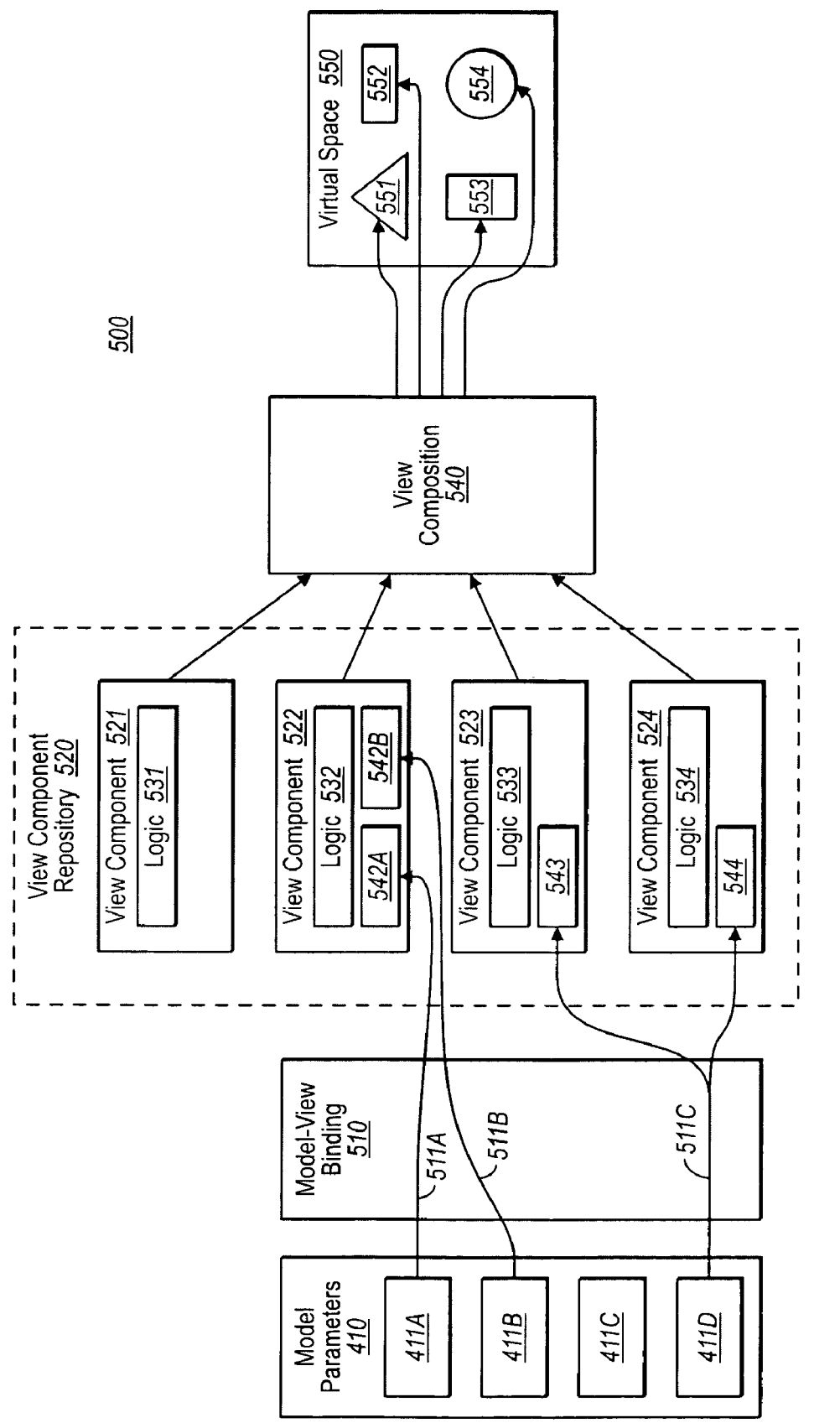
FIG. 5 schematically illustrates an embodiment of the view portion of the pipeline of FIG. 2.

FIG. 5 illustrates a view portion 500 which represents an example of the view portion 230 of FIG. 2. The view portion 500 receives the model parameters 411 from the analytics portion 400 of FIG. 4. The view portion also includes a view components repository 520 that contains a collection of view components. For example, the view components repository 520 in this example is illustrated as including view components 521 through 524, although the view components repository 520 may contain any number of view components. The view components each may include zero or more input parameters. For example, view component 521 does not include any input parameters. However, view component 522 includes two input parameters 542A and 542B. View component 523 includes one input parameter 543, and view component 524 includes one input parameter 544. That said, this is just an example. The input parameters may, but need not necessary, affect how the visual item is rendered. The fact that the view component 521 does not include any input parameters emphasizes that there can be views that are generated without reference to any model parameters. Consider a view that comprises just fixed (built-in) data that does not change. Such a view might for example constitute reference information for the user. Alternatively, consider a view that just provides a way to browse a catalog, so that items can be selected from it for import into a model.

Each view component 521 through 524 includes or is associated with corresponding logic that, when executed by the view composition component 540 using the corresponding view component input parameter(s), if any, causes a corresponding view item to be placed in virtual space 550. That virtual item may be a static image or object, or may be a dynamic animated virtual item or object For instance, each of view components 521 through 524 are associated with corresponding logic 531 through 534 that, when executed causes the corresponding virtual item 551 through 554, respectively, to be rendered in virtual space 550. The virtual items are illustrated as simple shapes. However, the virtual items may be quite complex in form perhaps even including animation. In this description, when a view item is rendered in virtual space, that means that the view composition component has authored sufficient instructions that, when provided to the rendering engine, the rendering engine is capable if displaying the view item on the display in the designated location and in the designated manner.

The view components 521 through 524 may be provided perhaps even as view data to the view portion 500 using, for example, the authoring component 240 of FIG. 2. For instance, the authoring component 240 might provide a selector that enables the author to select from several geometric forms, or perhaps to compose other geometric forms. The author might also specify the types of input parameters for each view component, whereas some of the input parameters may be default input parameters imposed by the view portion 500. The logic that is associated with each view component 521 through 524 may be provided also a view data, and/or may also include some default functionality provided by the view portion 500 itself.

The view portion 500 includes a model-view binding component 510 that is configured to bind at least some of the model parameters to corresponding input parameters of the view components 521 through 524. For instance, model parameter 411A is bound to the input parameter 542A of view component 522 as represented by arrow 511A. Model parameter 411B is bound to the input parameter 542B of view component 522 as represented by arrow 511B. Also, model parameter 411D is bound to the input parameters 543 and 544 of view components 523 and 524, respectively, as represented by arrow 511C. The model parameter 411C is not shown bound to any corresponding view component parameter, emphasizing that not all model parameters need be used by the view portion of the pipeline, even if those model parameters were essential in the analytics portion. Also, the model parameter 411D is shown bound to two different input parameters of view components representing that the model parameters may be bound to multiple view component parameters. In one embodiment, The definition of the bindings between the model parameters and the view component parameters may be formulated by 1) being explicitly set by the author at authoring time, 2) explicit set by the user at use time (subject to any restrictions imposed by the author), 3) automatic binding by the authoring component 240 based on algorithmic heuristics, and/or 4) prompting by the authoring component of the author and/or user to specify a binding when it is determined that a binding cannot be made algorithmically.

As previously mentioned, the view item may include an animation. To take a simple example, consider for example a bar chart that plots a company's historical and projected revenues, advertising expenses, and profits by sales region at a given point in time (such as a given calendar quarter). A bar chart could be drawn for each calendar quarter in a desired time span. Now, imagine that you draw one of these charts, say the one for the earliest time in the time span, and then every half second replace it with the chart for the next time span (e.g., the next quarter). The result will be to see the bars representing profit, sales, and advertising expense for each region change in height as the animation proceeds. In this example, the chart for each time period is a "cell" in the animation, where the cell shows an instant between movements, where the collection of cells shown in sequence simulates movement. Conventional animation models allow for animation over time using built-in hard-coded chart types.

However, using the pipeline 201, by contrast, any kind of visual can be animated, and the animation can be driven by varying any one or any combination of the parameters of the visual component. To return to the bar chart example above, imagine that instead of animating by time, we animate by advertising expense. Each "cell" in this animation is a bar chart showing sales and profits over time for a given value of advertising expense. Thus, as the advertising expense is varied, the bars grow and shrink in response to the change in advertising expense.

The power of animated data displays is that they make very apparent to the eye what parameters are most sensitive to change in other parameters, because you immediately see how quickly and how far each parameter's values change in response to the varying of the animation parameter.

The pipeline 201 is also distinguished in its ability to animate due to the following characteristics:

First, the sequences of steps for the animation variable can be computed by the analytics of the model, versus being just a fixed sequence of steps over a predefined range. For example, in the example of varying the advertising expense as the animation variable, imagine that what is specified is to "animate by advertising expense where advertising expense is increased by 5% for each step" or "where advertising expense is 10% of total expenses for that step". A much more sophisticated example is "animate by advertising expense where advertising expense is optimized to maximize the rate of change of sales over time". In other words, the solver will determine a set of steps for advertising spend over time (i.e., for each successive time period such as quarter) such that the rate of growth of sales maximized. Here the user presumably wants to see not only how fast sales can be made to grow by varying advertising expense, but also wants to learn the quarterly amounts for the advertising expense that achieve this growth (the sequence of values could be plotted as part of the composite visual).

Second, any kind of visual can be animated, not just traditional data charts. For example, consider a Computer-Aided Design (CAD) model of a jet engine that is a) to be animated by the air speed parameter and 2) where the rotational speed of the turbine is a function of the air speed and 3) where the temperature of the turbine bearings is a function of the air speed. Jet engines have limits on how fast turbines can be rotated before either the turbine blades lose integrity or the bearing overheats. Thus, in this animation we desire that as air speed is varied the color of the turbine blades and bearing should be varied from blue (safe) to red (critical). The values for "safe" and "critical" turbine RPM and bearing temperature may well be calculated by the model based on physical characteristics of those parts. Now, as the animation varies the air speed over a defined range, we see the turbine blades and bearing each change color. What is now interesting is to notice which reaches critical first, and if either undergoes a sudden (runway) run to critical. These kinds of effects are hard to discern by looking at a chart or at a sequence of drawings, but become immediately apparent in an animation. This is but one example of animating an arbitrary visual (CAD model) by an arbitrary parameter (air speed), with the animation affecting yet other arbitrary parameters (turbine RPM and bearing temp). Any parameter(s) of any visual(s) can be animated according to any desired parameter(s) that are to serve as the animation variables.

Third, the pipeline 201 can be stopped mid stream so that data and parameters may be modified by the user, and the animation then restarted or resumed. Thus, for example, in the jet engine example, if runaway heating is seen to start at a given air speed, the user may stop the animation at the point the runaway beings, modify some engine design criterion, such as the kind of bearing or bearing surface material, and then continue the animation to see the effect of the change.

As with other of the capabilities discussed herein, animations can be defined by the author, and/or left open for the user to manipulate to test various scenarios. For example, the model may be authored to permit some visuals to be animated by the user according to parameters the user himself selects, and/or over data ranges for the animation variable that the user selects (including the ability to specify computed ranges should that be desired). Such animations can also be displayed side by side as in the other what-if comparison displays. For example, a user could compare an animation of sales and profits over time, animated by time, in two scenarios with differing prevailing interest rates in the future, or different advertising expenses ramps. In the jet engine example, the user could compare the animations of the engine for both the before and after cases of changing the bearing design.

At this point, a specific example of how the composition framework may be used to actually construct a view composition will be described with respect to FIG. 6, which illustrated 3-D renderings 600 of a view composition that includes a room layout 601 with furniture laid out within the room, and also includes a Feng Shui meter 602. This example is provided merely to show how the principles described herein can apply to any arbitrary view composition, regardless of the domain. Accordingly, the example of FIG. 6, and any other example view composition described herein, should be viewed strictly as only an example that allows the abstract concept to be more fully understood by reference to non-limiting concrete examples, and not defining the broader scope of the invention. The principles described herein may apply to construct an enumerable variety of view compositions. Nevertheless, reference to a concrete example can clarify the broader abstract principles.

Figure 6:
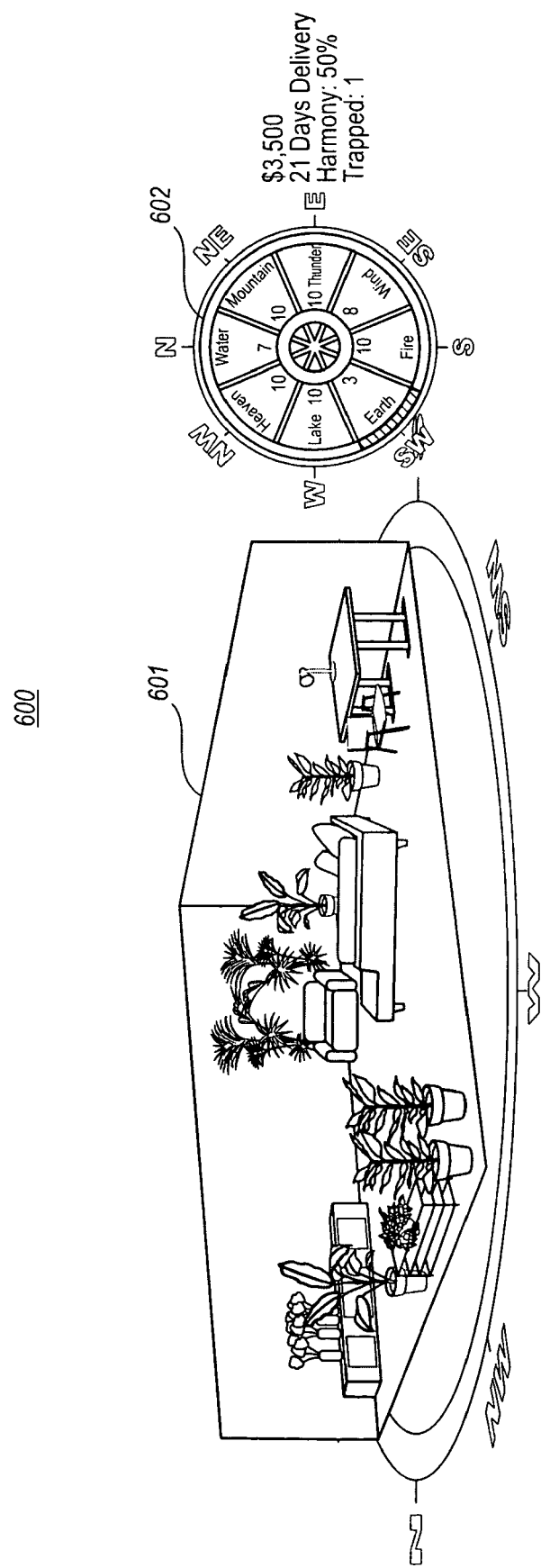
FIG. 6 illustrates a rendering of a view composition that may be as constructed by the pipeline of FIG. 2.
Figure 7:
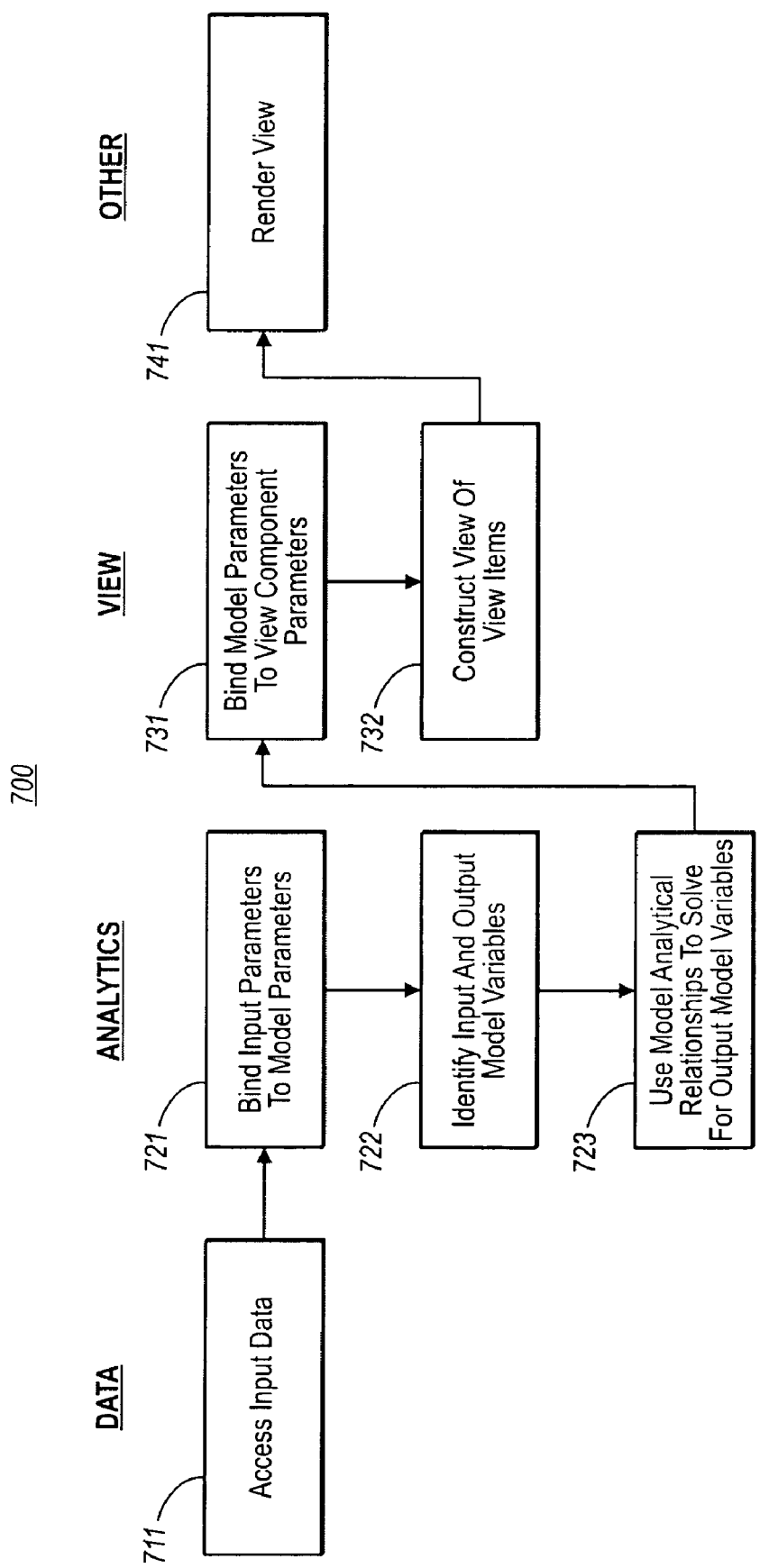
FIG. 7 illustrates a flowchart of a method for generating a view composition using the pipeline environment of FIG. 2.

FIG. 7 illustrates a flowchart of a method 700 for generating a view construction. The method 700 may be performed by the pipeline environment 200 of FIG. 2, and thus will be described with frequent reference to the pipeline environment 200 of FIG. 2, as well as with reference to FIGS. 3 through 5, which each show specific portions of the pipeline of FIG. 2. While the method 700 may be performed to construct any view composition, the method 700 will be described with respect to the view composition 600 of FIG. 6. Some of the acts of the method 700 may be performed by the data portion 210 of FIG. 2 and are listed in the left column of FIG. 7 under the header "Data". Other of the acts of the method 700 may be performed by the analytics portion 220 of FIG. 2, and are listed in the second from the left column of FIG. 7 under the header "Analytics". Other of the acts of the method are performed by the view portion 230 of FIG. 2, and are listed in the second from the right column under the header "View". One of the acts may be performed by a rendering module and is listed in the right column under the header other. Any conventional or yet to be developed rendering module may be used to render a view composition constructed in accordance with the principles described herein.

Referring to FIG. 7, the data portion accesses input data that at least collectively affects what visual items are displayed or how a given one or more of the visual items are displayed (act 711). For instance, referring to FIG. 6, the input data might include view components for each of the items of furniture. For instance, each of the couch, the chair, the plants, the table, the flowers, and even the room itself may be represented by a corresponding view component. The view component might have input parameters that are suitable for the view component. If animation were employed, for example, some of the input parameters might affect the flow of the animation. Some of the parameters might affect the display of the visual item, and some parameters might not.

For instance, the room itself might be a view component. Some of the input parameters might include the dimensions of the room, the orientation of the room, the wall color, the wall texture, the floor color, the floor type, the floor texture, the position and power of the light sources in the room, and so forth. There might also be room parameters that do not necessarily get reflected in this view composition, but might get reflected in other views and uses of the room component. For instance, the room parameter might have a location of the room expressed in degrees, minutes, and seconds longitude and latitude. The room parameter might also include an identification of the author of the room component, and the average rental costs of the room.

The various components within the room may also be represented by a corresponding parameterized view component. For instance, each plant may be configured with an input parameter specifying a pot style, a pot color, pot dimensions, plant color, plant resiliency, plant dependencies on sunlight, plant daily water intake, plant daily oxygen production, plant position and the like. Once again, some of these parameters may affect how the display is rendered and others might not, depending on the nature of what is being displayed.

The Feng Shui meter 602 may also be a view component. The meter might include input parameters such as a diameter, a number of wedges to be contained in the diameter of the meter, a text color and the like. The various wedges of the Feng Shui meter may also be view components. In that case, the input parameters to the view components might be a title (e.g., water, mountain, thunder, wind, fire, earth, lake, heaven), perhaps a graphic to appear in the wedge, a color hue, or the like.

The analytics portion binds the input data to the model parameters (act 721), determines the output model variables (act 722), and uses the model-specific analytical relationships between the model parameters to solve for the output model variables (act 723). The binding operation of act 721 has been previously discussed, and essentially allows flexibility in allowing the author to define the model analytics equations, rules and constraints using symbols that the model author is comfortable with.

The identification or the output model variables may differ from one solving operation to the next. Even though the model parameters may stay the same, the identification of which model parameters are output model variables will depend on the availability of data to bind to particular model parameters. This has remarkable implications in terms of allowing a user to perform what-if scenarios in a given view composition.

For instance, in the Fung Shui room example of FIG. 6, suppose the user has bought a new chair to place in their living room. The user might provide the design of the room as data into the pipeline. This might be facilitated by the authoring component prompting the user to enter the room dimensions, and perhaps provide a selection tool that allows the user to select virtual furniture to drag and drop into the virtual room at appropriate locations that the actual furniture is placed in the actual room. The user might then select a piece of furniture that may be edited to have the characteristics of the new chair purchased by the user. The user might then drag and drop that chair into the room. The Feng Shui meter 602 would update automatically. In this case, the position and other attributes of the chair would be input model variables, and the Feng Shui scores would be output model variables. As the user drags the virtual chair to various positions, the Feng Shui scores of the Feng Shui meter would update, and the user could thus test the Feng Shui consequences of placing the virtual chair in various locations. To avoid the user from having to drag the chair to every possible location to see which gives the best Feng Shui, the user can get local visual clues (such as, for example, gradient lines or arrows) that tell the user whether moving the chair in a particular direction from its current location makes things better or worse, and how much better or worse.

However, the user could also do something else that is unheard of in conventional view composition. The user could actually change the output model variables. For instance, the user might indicate the desired Feng Shui score in the Feng Shui meter, and leave the position of the virtual chair as the output model variable. The solver would then solve for the output model variable and provide a suggested position or positions of the chair that would achieve at least the designated Feng Shui score. The user may choose to make multiple parameters output model variables, and the system may provide multiple solutions to the output model variables. This is facilitated by a complex solver that is described in further detail with respect to FIG. 9.

Returning to FIG. 7, once the output model variables are solved for, the model parameters are bound to the input parameters of the parameterized view components (act 731). For instance, in the Feng Shui example, after the unknown Feng Shui scores are solved for, the scores are bound as input parameters to Feng Shui meter view component, or perhaps to the appropriate wedge contained in the meter. Alternatively, if the Feng Shui scores were input model variables, the position of the virtual chair may be solved for and provided as an input parameter to the chair view component.

A simplified example will now be presented that illustrates the principles of how the solver can rearrange equations and change the designation of input and output model variables all driven off of one analytical model. The user herself does not have to rearrange the equations. The simplified example may not accurately represent Feng Shui rules, but illustrates the principle nevertheless. Suppose the total Feng Shui (FS) of the room (FSroom) equals the FS of a chair (FSchair) and the FS of a plant (FSplant). Suppose FSchair is equal to a constant A times the distance d of the chair from the wall. Suppose FSplant is a constant, B. The total FS of the room is then: FSroom=A*d+B. If d is an input model variable, then FSroom is an output model variable and its value, displayed on the meter, changes as user repositions the chair. Now suppose the user now clicks on the meter making it an input model variable and shifting d into unknown output model variable status. In this case, the solver effectively and internally rewrites the equation above as d=(FSroom−B)/A. In that case, the view component can move the chair around, changing d, its distance from the wall, as the user changes the desired value, FSroom, on the meter.

The view portion then constructs a view of the visual items (act 732) by executing the construction logic associated with the view component using the input parameter(s), if any, to perhaps drive the construction of the view item in the view composition. The view construction may then be provided to a rendering module, which then uses the view construction as rendering instructions (act 741).

In one embodiment, the processing of constructing a view is treated as a data transformation that is performed by the solver. That is, for a given kind of view (e.g., consider a bar chart), there is a model consisting of rules, equations, and constraints that generates the view by transforming the input data into a displayable output data structure (called a scene graph) which encodes all the low level geometry and associated attributes needed by the rendering software to drive the graphics hardware. In the bar chart example, the input data would be for example the data series that is to be plotted, along with attributes for things like the chart title, axis labels, and so on. The model that generates the bar would have rules, equations, and constraints that would do things like 1) count how many entries the data series consists of in order to determine how many bars to draw, 2) calculate the range (min, max) that the data series spans in order to calculate things like the scale and starting/ending values for each axis, 3) calculate the height of the bar for each data point in the data series based on the previously calculated scale factor, 4) count how many characters are in the chart title in order to calculate a starting position and size for the title so that the title will be properly located and centered with respect to the chart, and so forth. In sum, the model that is designed to calculate a set of geometric shapes based on the input data, with those geometric shapes arranged within a hierarchical data structure of type "scene graph". In other words, the scene graph is an output variable that the model solves for based on the input data. Thus, an author can design entirely new kinds of views, customized existing views, and compose preexisting views into composites, using the same framework that the author uses to author, customize, and compose any kind of model. Thus, authors who are not programmers can create new views without drafting new code.

Figure 8:
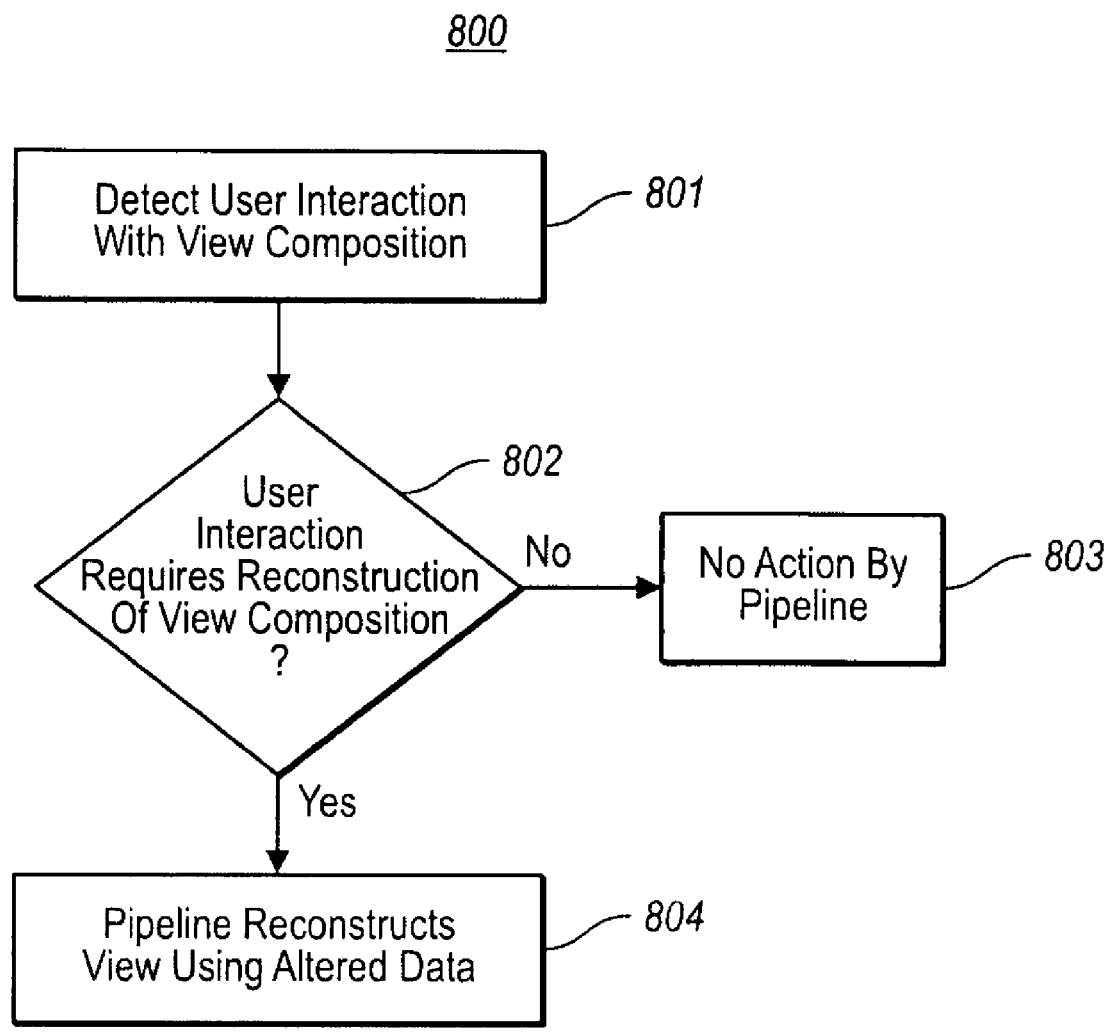
FIG. 8 illustrates a flowchart of a method for regenerating a view composition in response to user interaction with the view composition using the pipeline environment of FIG. 2.

Returning to FIG. 2, recall that the user interaction response module 250 detects when the user interacts with the view composition, and causes the pipeline to respond appropriately. FIG. 8 illustrates a flowchart of a method 800 for responding to user interaction with the view composition. In particular, the user interaction response module determines which the components of the pipeline should perform further work in order to regenerate the view, and also provides data represented the user interaction, or that is at least dependent on the user interaction, to the pipeline components. In one embodiment, this is done via a transformation pipeline that runs in the reverse (upstream) view/analytics/data direction and is parallel to the (downstream) data/analytics/view pipeline.

Interactions are posted as events into the upstream pipeline. Each transformer in the data/analytics/view pipeline provides an upstream transformer that handles incoming interaction data. These transformers can either be null (passthroughs, which get optimized out of the path) or they can perform a transformation operation on the interaction data to be fed further upstream. This provides positive performance and responsiveness of the pipeline in that 1) interaction behaviors that would have no effect on upstream transformations, such as a view manipulation that has no effect on source data, can be handled at the most appropriate (least upstream) point in the pipeline and 2) intermediate transformers can optimize view update performance by sending heuristically-determined updates back downstream, ahead of the final updates that will eventually come from further upstream transformers. For example, upon receipt of a data edit interaction, a view-level transformer could make an immediate view update directly into the scene graph for the view (for edits it knows how to interpret), with the final complete update coming later from the upstream data transformer where the source data is actually edited.

When the semantics of a given view interaction have a nontrivial mapping to the needed underlying data edits, intermediate transformers can provide the needed upstream mapping. For example, dragging a point on a graph of a computed result could require a backwards solve that would calculate new values for multiple source data items that feed the computed value on the graph. The solver-level upstream transformer would be able to invoke the needed solve and to propagate upstream the needed data edits.

FIG. 8 illustrates a flowchart of a method 800 for responding to user interaction with the view construction. Upon detecting that the user has interacted with the rendering of a view composition on the display (act 801), it is first determined whether or not the user interaction requires regeneration of the view (decision block 802). This may be performed by the rendering engine raising an event that is interpreted by the user interaction response component 250 of FIG. 2. If the user interaction does not require regeneration of the view (No in decision block 802), then the pipeline does not perform any further action to reconstruct the view (act 803), although the rendering engine itself may perform some transformation on the view. An example of such a user interaction might be if the user were to increase the contrast of the rendering of the view construction, or rotate the view construction. Since those actions might be undertaen by the rendering engine itself, the pipeline need perform no work to reconstruct the view in response to the user interaction.

If, on the other hand, it is determined that the type of user interaction does require regeneration of the view construction (Yes in decision block 802), the view is reconstructed by the pipeline (act 704). This may involve some altering of the data provided to the pipeline. For instance, in the Feng Shui example, suppose the user were to move the position of the virtual chair within the virtual room, the position parameter of the virtual chair component would thus change. An event would be fired informing the analytics portion that the corresponding model parameter representing the position of the virtual chair should be altered as well. The analytics component would then resolve for the Feng Shui scores, repopulate the corresponding input parameters of the Feng Shui meter or wedges, causing the Feng Shui meter to update with current Feng Shui scores suitable for the new position of the chair.

The user interaction might require that model parameters that were previously known are now unknown, and that previously unknown parameters are now known. That is one of several possible examples that might require a change in designation of input and output model variables such that previously designated input model variables might become output model variables, and vice versa. In that case, the analytics portion would solve for the new output model variable(s) thereby driving the reconstruction of the view composition.

Solver Framework

Figure 9:
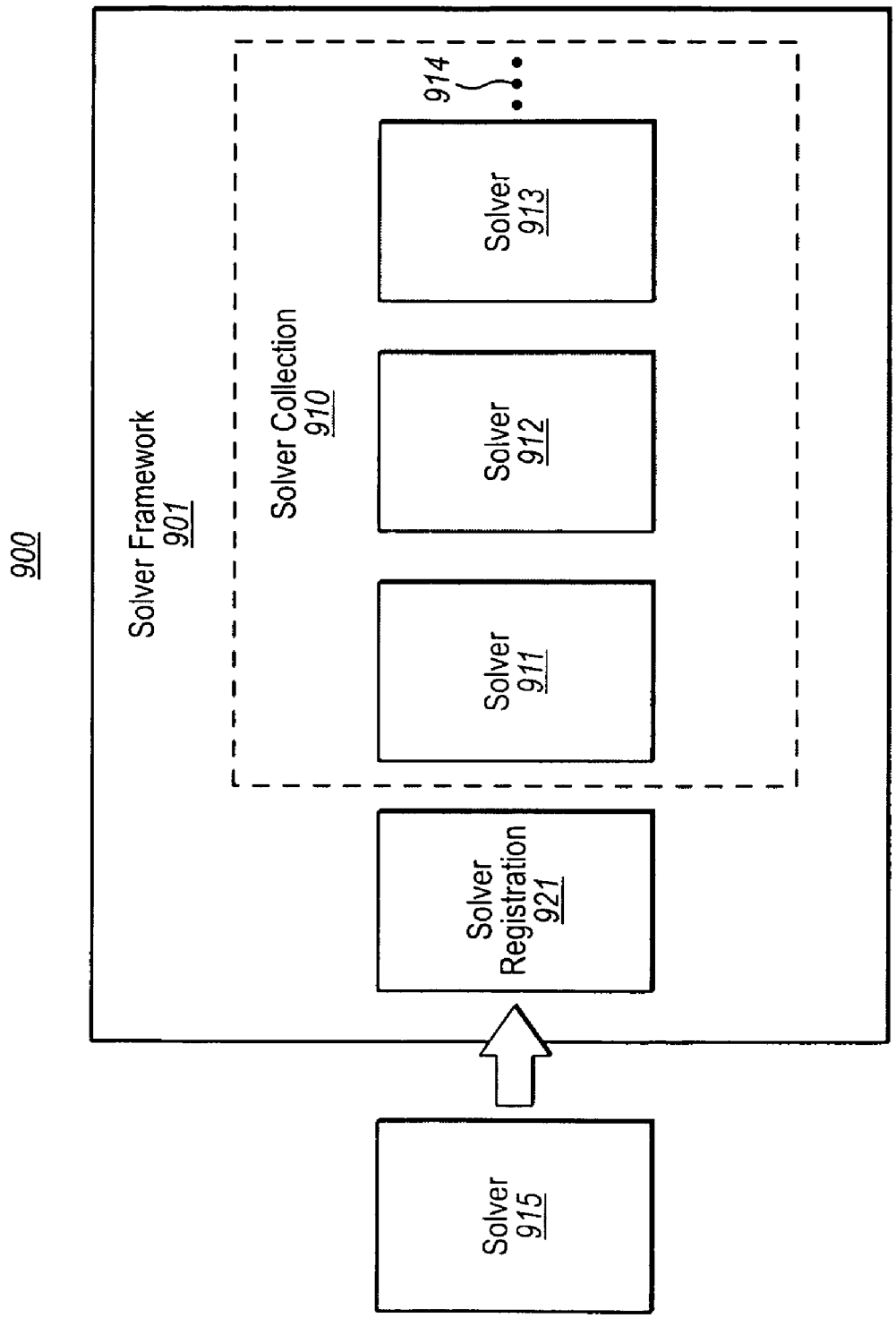
FIG. 9 schematically illustrates the solver of the analytics portion of FIG. 4 in further detail including a collection of specialized solvers.

FIG. 9 illustrates a solver environment 900 that may represent an example of the solver 440 of FIG. 4. The solver environment 900 may be implemented in software, hardware, or a combination. The solver environment 900 includes a solver framework 901 that manages and coordinates the operations of a collection 910 of specialized solvers. The collection 910 is illustrated as including three specialized solvers 911, 912 and 913, but the ellipses 914 represents that there could be other numbers (i.e., more than three or less than three) of specialized solvers as well. Furthermore, the ellipsis 914 also represents that the collection 910 of specialized solves is extensible. As new specialized solvers are discovered and/or developed that can help with the model analytics, those new specialized solvers may be incorporated into the collection 910 to supplement the existing specialized solvers, or perhaps to replace one or more of the existing solvers. For example, FIG. 9 illustrates that a new solver 915 is being registered into the collection 910 using the solver registration module 921. As one example, a new solver might be perhaps a simulation solver which accepts one or more known values, and solves for one or more unknown values. Other examples include solvers for systems of linear equations, differential equations, polynomials, integrals, root-finders, factorizers, optimizers, and so forth. Every solver can work in numerical mode or in symbolic mode or in mixed numeric-symbolic mode. The numeric portions of solutions can drive the parameterized rendering downstream. The symbolic portions of the solution can drive partial solution rendering.

The collection of specialized solvers may include any solver that is suitable for solving for the output model variables. If, for example, the model is to determine drag of a bicycle, the solving of complex calculus equations might be warranted. In that case, a specialized complex calculus solver may be incorporated into the collection 910 to perhaps supplement of replace an existing equations solver. In one embodiment, each solver is designed to solve for one or more output model variables in a particular kind of analytics relationship. For example, there might be one or more equation solvers configured to solve for unknowns in an equation. There might be one or more rules solvers configured to apply rules to solve for unknowns. There might be one or more constraints solvers configured to apply constraints to thereby solve for unknowns. Other types of solves might be, for example, a simulation solver which performs simulations using input data to thereby construct corresponding output data.

The solver framework 901 is configured to coordinate processing of one or more or all of the specialized solvers in the collection 910 to thereby cause one or more output model variables to be solved for. The solver framework 901 is then configured to provide the solved for values to one or more other external components. For instance, referring to FIG. 2, the solver framework 901 may provide the model parameter values to the view portion 230 of the pipeline, so that the solving operation thereby affects how the view components execute to render a view item, or thereby affect other data that is associated with the view item. As another potential effect of solving, the model analytics themselves might be altered. For instance, as just one of many examples in which this might be implemented, the model might be authored with modifiable rules set so that, during a given solve, some rule(s) and/or constraint(s) that are initially inactive become activated, and some that are initially activated become inactivated. Equations can be modified this way as well.

Figure 10:
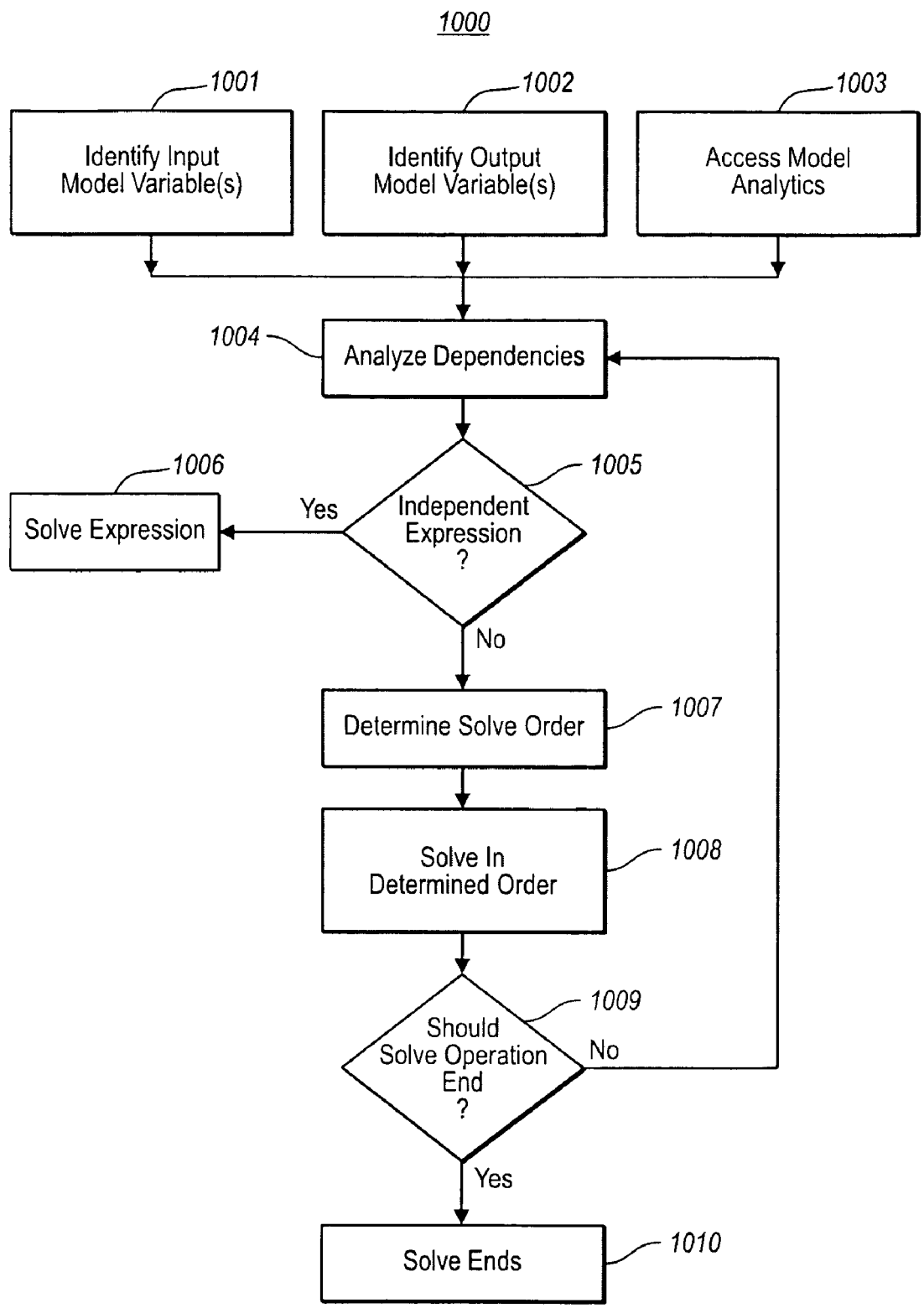
FIG. 10 illustrates a flowchart of the solver of FIG. 9 solving for unknown model parameters by coordinating the actions of a collection of specialized solvers.

FIG. 10 illustrates a flowchart of a method 1000 for the solver framework 901 to coordinate processing amongst the specialized solvers in the collection 910. The method 1000 of FIG. 10 will now be described with frequent reference to the solver environment 900 of FIG. 9.

The solver framework begins a solve operation by identifying which of the model parameters are input model variables (act 1001), and which of the model parameters are output model variables (act 1002), and by identifying the model analytics that define the relationship between the model parameters (act 1003). Given this information, the solver framework analyzes dependencies in the model parameters (act 1004). Even given a fixed set of model parameters, and given a fixed set of model analytics, the dependencies may change depending on which of the model parameters are input model variables and which are output model variables. Accordingly, the system can infer a dependency graph each time a solve operation is performed using the identity of which model parameters are input, and based on the model analytics. The user need not specify the dependency graph for each solve. By evaluating dependencies for every solve operation, the solver framework has the flexibility to solve for one set of one or more model variables during one solve operation, and solve for another set of one or more model variables for the next solve operation. In the context of FIGS. 2 through 5, that means greater flexibility for a user to specify what is input and what is output by interfacing with the view composition.

In some solve operations, the model may not have any output model variables at all. In that case, the solve will verify that all of the known model parameter values, taken together, satisfy all the relationships expressed by the analytics for that model. In other words, if you were to erase any one data value, turning it into an unknown, and then solve, the value that was erased would be recomputed by the model and would be the same as it was before. Thus, a model that is loaded can already exist in solved form, and of course a model that has unknowns and gets solves now also exists in solved form. What is significant is that a user interacting with a view of a solved model is nevertheless able to edit the view, which may have the effect of changing a data value or values, and thus cause a re-solve that will attempt to recompute data values for output model variables so that the new set of data values is consistent with the analytics. Which data values a user can edit (whether or not a model starts with output model variables) is controlled by the author; in fact, this is controlled by the author defining which variables represented permitted unknowns.

If there are expressions that have one or more unknowns that may be independently solved without first solving for other unknowns in other expressions (Yes in decision block 1005), then those expressions may be solved at any time (act 1006), even perhaps in parallel with other solving solving steps. On the other hand, if there are expressions that have unknowns that cannot be solved without first solving for an unknown in another expression, then a solve dependency has been found. In that case, the expression becomes part of a relational structure (such as a dependency tree) that defines a specific order of operation with respect to another expression.

In the case of expressions that have interconnected solve dependencies from other expressions, an order of execution of the specialized solvers is determined based on the analyzed dependencies (act 1007). The solvers are then executed in the determined order (act 1008). In one example, in the case where the model analytics are expressed as equations, constraints, and rules, the order of execution may be as follows 1)

equations with dependencies or that are not fully solvable as an independent expression are rewritten as constraints 2) the constraints are solved, 3) the equations are solved, and 4) the rules are solved. The rules solving may cause the data to be updated.

Once the solvers are executed in the designated order, it is then determined whether or not solving should stop (decision block 1009). The solving process should stop if, for example, all of the output model variables are solved for, or if it is determined that even though not all of the output model varaibles are solved for, the specialized solvers can do nothing further to solve for any more of the output model variables. If the solving process should not end (No in decision block 1009), the process returns back to the analyzing of dependencies (act 1004). This time, however, the identity of the input and output model variables may have changed due to one or more output model variables being solved for. On the other hand, if the solving process should end (Yes in decision block 1009) the solve ends (act 1010). However, if a model cannot be fully solved because there are too many output model variables, the model nevertheless may succeed in generating a partial solution where the output model variable have bee assigned symbolic values reflective of how far the solve was able to proceed. For example, if a model has an equation A=B+C, and B is known to be "2" and is an input model variable but C is an output model variable and A is also an output model variable and needs to be solved for, the model solver cannot product a numerical value for A since while B is known C is unknown; so instead of a full solve, the solver returns "2+C" as the value for A. It is thus clear to the author what additional variable needs to become known, either by supplying it a value or by adding further rules/equations/constraints or simulations that can successfully produce the needed value from other input data.

This method 1000 may repeat each time the solver framework detects that there has been a change in the value of any of the known model parameters, and/or each time the solver framework determines that the identity of the known and unknown model parameters has changed. Solving can proceed in at least two ways. First, if a model can be fully solved symbolically (that is, if all equations, rules, and constraints can be algorithmically rewritten so that a computable expression exists for each unknown) then that is done, and then the model is computed. In other words, data values are generated for each unknown, and/or data values that are permitted to be adjusted are adjusted. As a second possible way, if a model cannot be fully solved symbolically, it is partially solved symbolically, and then it is determined if one or more numerical methods can be used to effect the needed solution. Further, an optimization step occurs such that even in the first case, it is determined whether use of numerical methods may be the faster way to compute the needed values versus performing the symbolic solve method. Although the symbolic method can be faster, there are cases where a symbolic solve may perform so many term rewrites and/or so many rewriting rules searches that it would be faster to abandon this and solve using numeric methods.

Composite View Composition

The pipeline 201 also includes a model importation mechanism 241 that is perhaps included as part of the authoring mechanism 240. The model importation mechanism 241 provides a user interface or other assistance to the author to allow the author to import at least a portion of a pre-existing analytics-driven model into the current analytics-driven model that the user is constructing. Accordingly, the author need not always begin from scratch when authoring a new analytics model. The importation may be of an entire analytics-driven model, or perhaps a portion of the model. For instance, the importation may cause one or more or all of the following six potential effects.

As a first potential effect of the importation, additional model input data may be added to the pipeline. For instance, referring to FIG. 2, additional data might be added to the input data 211, the analytics data 221 and/or the view data 231. The additional model input data might also include additional connectors being added to the data access component 310 of FIG. 3, or perhaps different canonicalization components 330.

As a second potential effect of the importation, there may be additional or modified bindings between the model input data and the model parameters. For instance, referring to FIG. 4, the data-model binder 410 may cause additional bindings to occur between the canonicalized data 401 and the model parameters 411. This may cause an increase in the number of known model parameters.

As a third potential effect of the importation, there may be additional model parameters to generate a supplemental set of model parameters. For instance, referring to FIG. 4, the model parameters 411 may be augmented due to the importation of the analytical behaviors of the imported model.

As a fourth potential effect of the importation, there may be additional analytical relationships (such as equations, rules and constraints) added to the model. The additional input data resulting from the first potential effect, the additional bindings resulting for the second potential effect, the additional model parameters resulting from the third potential effect, and the additional analytical relationships resulting from the fourth effect. Any one of more of these additional items may be viewed as additional data that affects the view composition. Furthermore, any one or more of these effects could change the behavior of the solver 440 of FIG. 4.

As a fifth potential effect of the importation, there may be additional or different bindings between the model parameters and the input parameters of the view. For instance, referring to FIG. 5, the model-view binding component 510 binds a potentially augmented set of model parameters 411 to a potentially augmented set of view components in the view component repository 520.

As a sixth potential effect of the importation, there may be additional parameterized view components added to the view component repository 520 of FIG. 5, resulting in perhaps new view items being added to the view composition.

Accordingly, by importing all or a portion of another model, the data associated with that model is imported. Since the view composition is data-driven, this means that the imported portions of the model are incorporated immediately into the current view composition.

When the portion of the pre-existing analytics-driven analytics model is imported, a change in data supplied to the pipeline 201 occurs, thereby causing the pipeline 201 to immediately, or in response to some other event, cause a regeneration of the view composition. Thus, upon what is essentially a copy and paste operation from an existing model, that resulting composite model might be immediately viewable on the display due to a resolve operation.

As an example of how useful this feature might be, consider the Feng Shui room view composition of FIG. 6. The author of this application may be a Feng Shui expert, and might want to just start from a standard room layout view composition model. Accordingly, by importing a pre-existing room layout model, the Feng Shui expert is now relatively quickly, if not instantly, able to see the room layout 601 show up on the display shown in FIG. 6. Not only that, but now the furniture and room item catalog that normally might come with the standard room layout view composition model, has now become available to the Feng Shui application of FIG. 6.

Now, the Feng Shui expert might want to import a basic pie chart element as a foundation for building the Feng Shui chart element 602. Now, however, the Feng Shui expert might specify specific fixed input parameters for the chart element including perhaps that there are 8 wedges total, and perhaps a background image and a title for each wedge. Now the Fung Shui expert need only specify the analytical relationships specifying how the model parameters are interrelated. Specifically, the color, position, and type of furniture or other room item might have an effect on a particular Feng Shui score. The expert can simply write down those relationships, to thereby analytically interconnect the room layout 601 and the Feng Shui score. This type of collaborative ability to build on the work of others may generate a tremendous wave of creativity in creating applications that solve problems and permit visual analysis. This especially contrasts with systems that might allow a user to visually program a one-way data flow using a fixed dependency graph. Those systems can do one-way solves, the way originally programmed from input to output. The principles described herein allow solves in multiple ways, depending on what is known and what is unknown at any time given the interactive session with the user.

Visual Interaction

The view composition process has been described until this point as being a single view composition being rendered at a time. For instance, FIG. 6 illustrates a single view composition generated from a set of input data. However, the principles described herein can be extended to an example in which there is an integrated view composition that includes multiple constituent view compositions. This might be helpful in a number of different circumstances.

For example, given a single set of input data, when the solver mechanism is solving for output model variables, there might be multiple possible solutions. The constituent view compositions might each represents one of multiple possible solutions, where another constituent view composition might represented another possible solution.

In another example, a user simply might want to retain a previous view composition that was generated using a particular set of input data, and then modify the input data to try a new scenario to thereby generate a new view composition. The user might then want to retain also that second view composition, and try a third possible scenario by altering the input data once again. The user could then view the three scenarios at the same time, perhaps through a side-by-side comparison, to obtain information that might otherwise be difficult to obtain by just looking at one view composition at a time.

Figure 11:
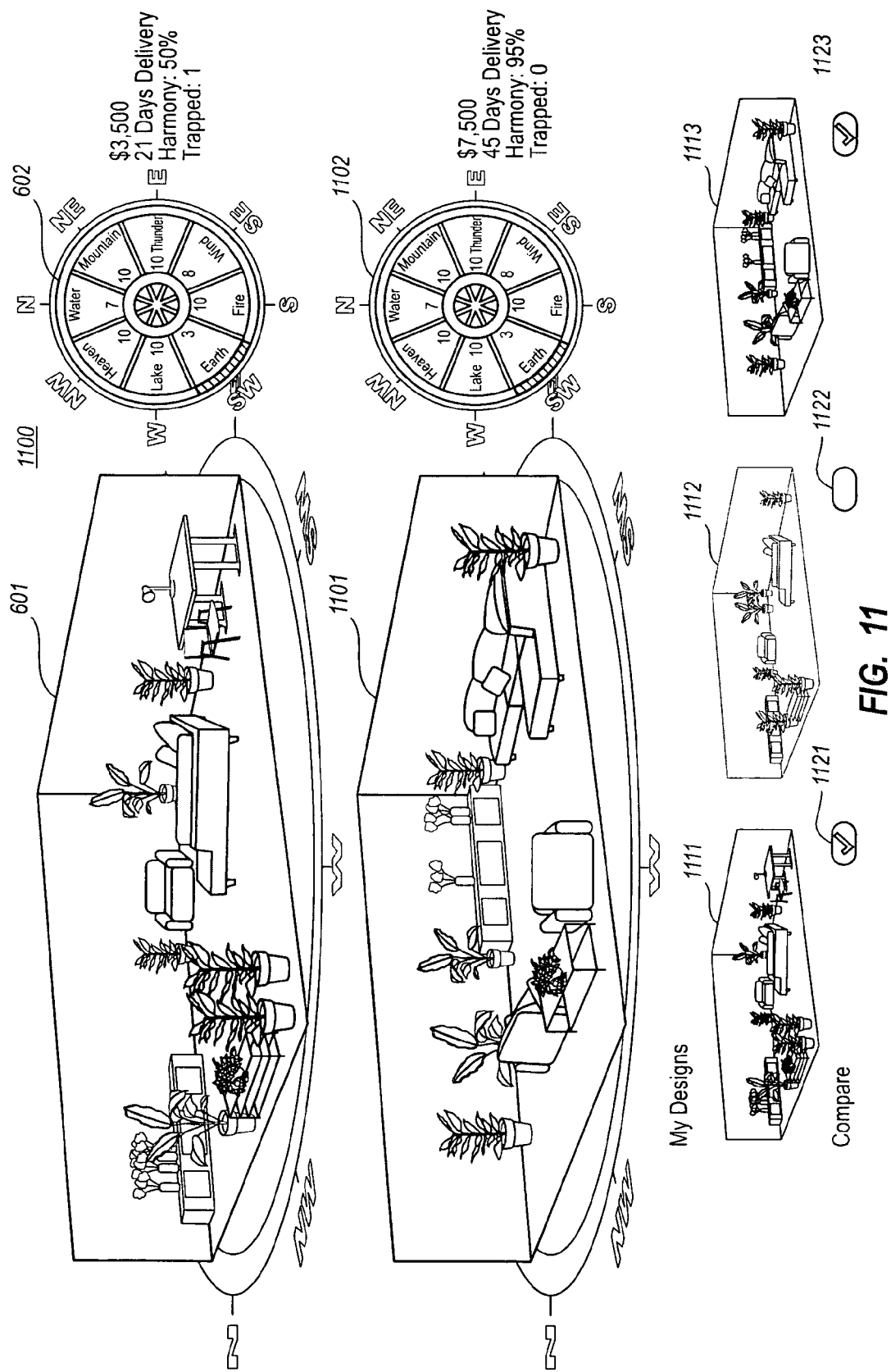
FIG. 11 illustrates a rendering of an integrated view composition that extends the example of FIG. 6.

FIG. 11 illustrates an integrated view composition 1100 that extends from the Feng Shui example of FIG. 6. In the integrated view composition, the first view composition 600 of FIG. 6 is represented once again using elements 601 and 602, exactly as shown in FIG. 6. However, here, there is a second view composition that is emphasized represented. The second view composition is similar to the first view composition in the there are two elements, a room display and a Feng Shui score meter. However, the input data for the second view composition was different than the input data for the first view composition. For instance, in this case, the position data for several of the items of furniture would be different thereby causing their position in the room layout 1101 of the second view composition to be different than that of the room layout 601 of the first view composition. However, the different position of the various furniture items correlates to different Fung Shui scores in the Fung Shui meter 1102 of the second view composition as compared to the Fung Shui meter 602 of the first view composition.

The integrated view composition may also include a comparison element that visually represents a comparison of a value of at least one parameter across some of all of the previously created and presently displayed view composition. For instance, in FIG. 11, there might be a bar graph showing perhaps the cost and delivery time for each of the displayed view compositions. Such a comparison element might be an additional view component in the view component repository 520. Perhaps that comparison view element might only be rendered if there are multiple view compositions being displayed. In that case, the comparison view composition input parameters may be mapped to the model parameters for different solving iterations of the model. For instance, the comparison view composition input parameters might be mapped to the cost parameter that was generated for both of the generations of the first and second view compositions of FIG. 11, and mapped to the delivery parameter that was generated for both of the generations of the first and second view compositions.

Referring to FIG. 11, there is also a selection mechanism 1110 that allows the user to visually emphasize a selected subset of the total available previously constructed view compositions. The selection mechanism 1110 is illustrated as including three possible view constructions 1111, 1112 and 1113, that are illustrated in thumbnail form, or are illustrated in some other deemphasized manner. Each thumbnail view composition 1111 through 1113 includes a corresponding checkbox 1121 through 1123. The user might check the checkbox corresponding to any view composition that is to be visually emphasized. In this case, the checkboxes 1121 and 1123 are checked, thereby causing larger forms of the corresponding view constructions to be displayed.

The integrated view composition, or even any single view composition for that matter, may have a mechanism for a user to interact with the view composition to designate what model parameters should be treated as an unknown thereby triggering another solve by the analytical solver mechanism. For instance, in the room display 1101 of FIG. 11, one might right click on a particular item of furniture, right click on a particular parameter (e.g., position), and a drop down menu might appear allowing the user to designate that the parameter should be treated as unknown. The user might then right click on the harmony percentage (e.g., 95% in the Fung Shui score meter 1102), whereupon a slider might appear (or a text box of other user input mechanism) that allows the user to designate a different harmony percentage. Since this would result in the identity of the known and unknown parameters being changed, a re-solve would result, and the item of furniture whose position was designated as an unknown might appear in a new location.

In one embodiment, the integrated view composition might also include a visual prompt for an adjustment that could be made that might trend a value of a model parameter in a particular direction. For example, in the Feng Shui example, if a particular harmony score is designated as a known input parameter, various positions of the furniture might be suggested for that item of furniture whose position was designated as an unknown. For instance, perhaps several arrows might emanate from the furniture suggesting a direction to move the furniture in order to obtain a higher harmony percentage, a different direction to move to maximize the water score, a different direction to move to maximum the water score, and so forth. The view component might also show shadows where the chair could be moved to increase a particular score. Thus, a user might user those visual prompts in order to improve the design around a particular parameter desired to be optimized. In another example, perhaps the user wants to reduce costs. The user might then designate the cost as an unknown to be minimized resulting in a different set of suggested furniture selections.

ADDITIONAL EXAMPLE APPLICATIONS

The architecture of FIGS. 1 and 2 may allow countless data-driven analytics model to be constructed, regardless of the domain. There is nothing at all the need be similar about these domains. Wherever there is a problem to be solved where it might be helpful to apply analytics to visuals, the principles described herein may be beneficial. Upon until now, only a few example applications have been described including a Feng Shui room layout application. To demonstrate the wide-ranging applicability of the principles described herein, several additional wide-ranging example applications will now be described.

Additional Example #1

Retailer Shelf Arrangements

Figure 12:
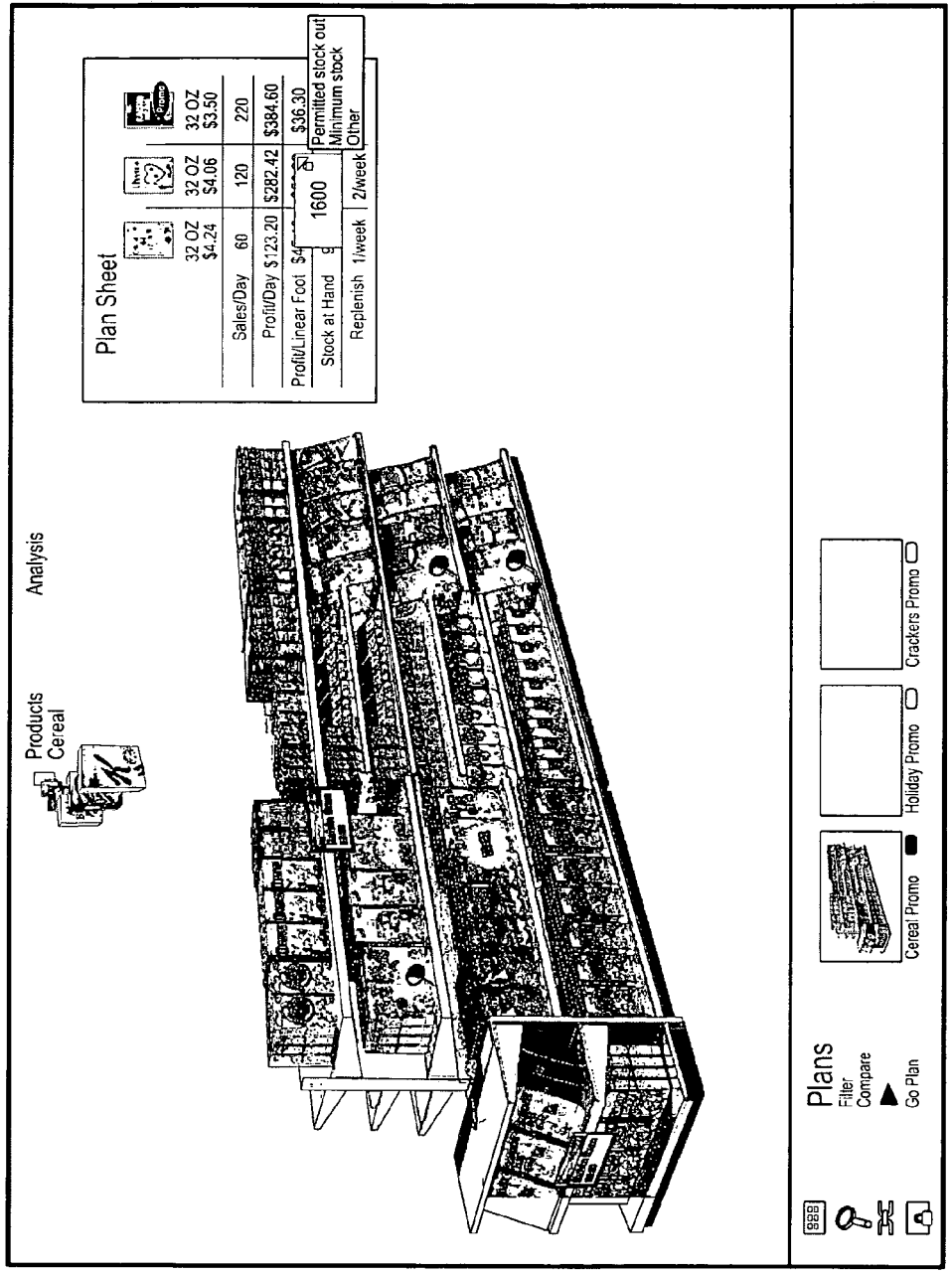

Product salespersons often use 3-D visualizations to sell retailers on shelf arrangements, end displays and new promotions. With the pipeline 201, the salesperson will be able to do what-ifs on the spot. Given some product placements and given a minimum daily sales/linear foot threshold, the salesperson may calculate and visualize the minimum required stock at hand. Conversely, given some stock at hand and given a bi-weekly replenishment cycle, the salesperson might calculate product placements that will give the desired sales/linear foot. The retailer will be able to visualize the impact, compare scenarios, and compare profits. FIG. 12 illustrates an example retailer shelf arrangement visualization. The input data might include visual images of the product, a number of the product, a linear square footage allocated for each product, and shelf number for each product, and so forth.

Additional Example #2

Urban Planning

Figure 13:
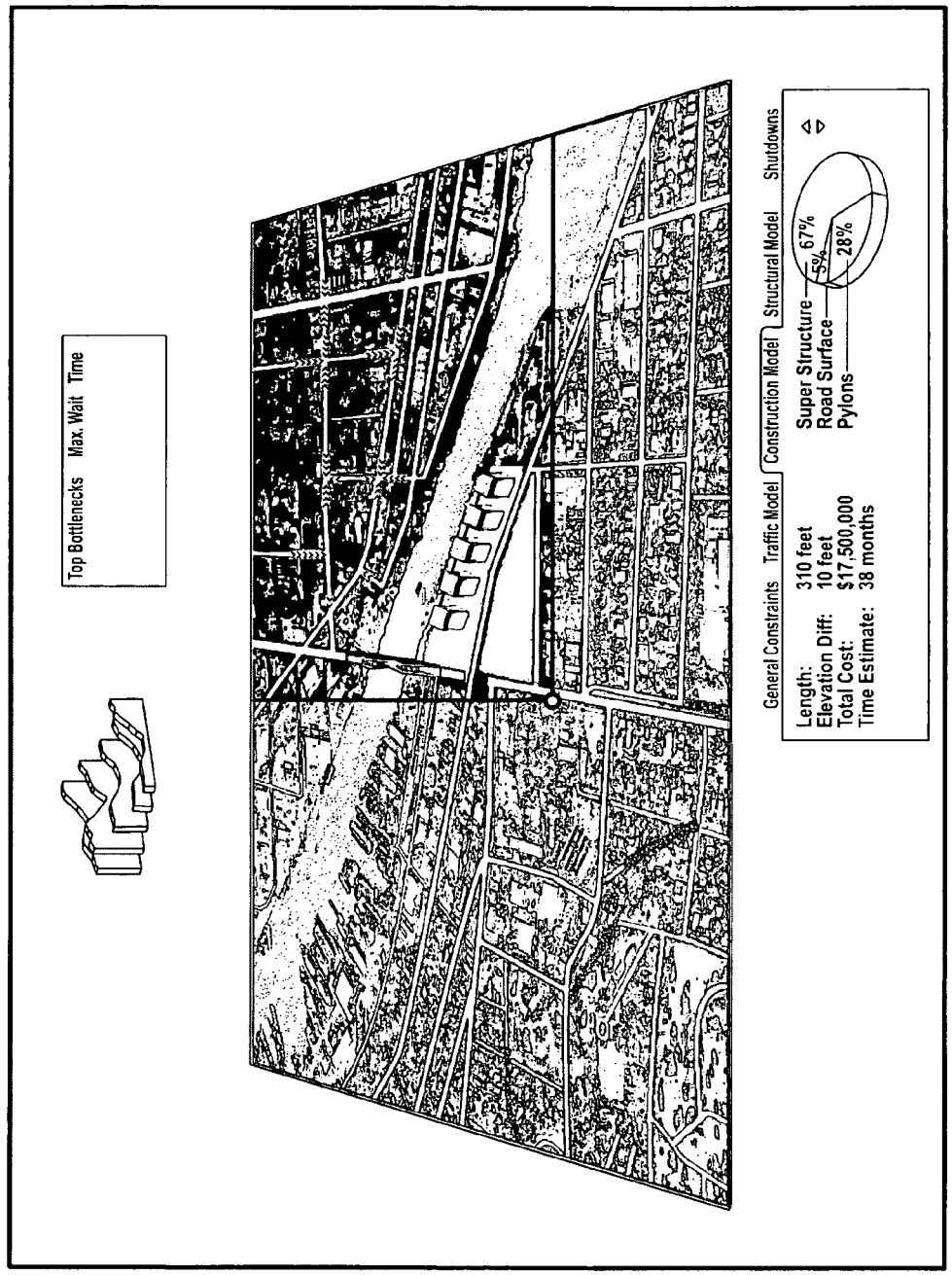

Urban planning mash ups are becoming prominent. Using the principles described herein, analytics can get integrated into such solutions. A city planner will open a traffic model created by experts, and drag a bridge in from a gallery of road improvements. The bridge will bring with it analytical behavior like length constraints and high-wind operating limits. Via appropriate visualizations, the planner will see and compare the effect on traffic of different bridge types and placements. The principles described herein may be applied to any map scenarios where the map might be for a wide variety of purposes. The map might be for understanding the features of a terrain and finding directions to some location. The map might also be a visual backdrop for comparing regionalized data. More recently, maps are being used to create virtual worlds in which buildings, interiors and arbitrary 2-D or 3-D objects can be overlaid or positioned in the map. FIG. 13 illustrates an example visualized urban plan.

Additional Example #3

Visual Education

Figure 14:
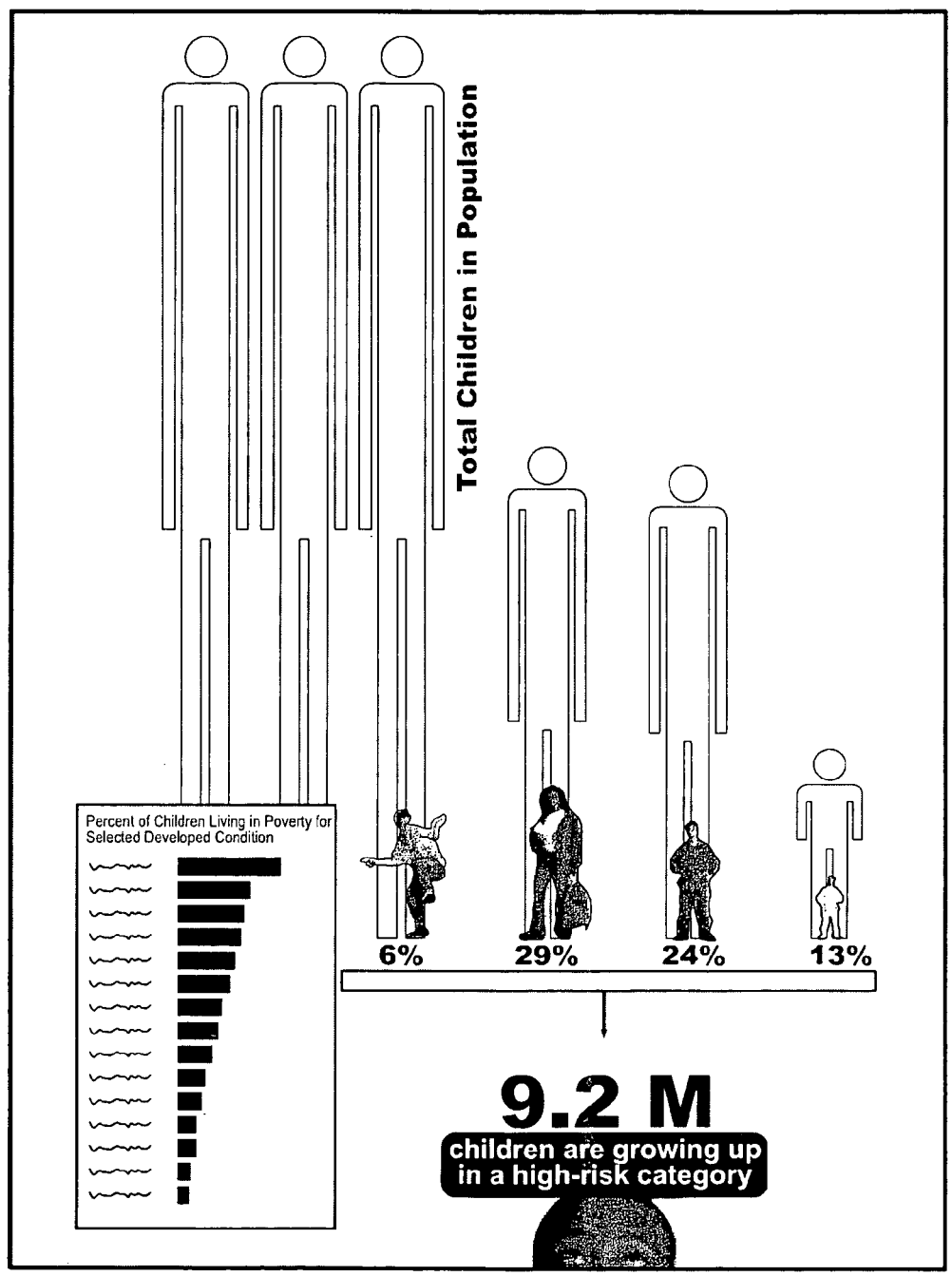
FIG. 14 illustrates a conventional visualization comparing children's education, that the principles of the present invention may apply to thereby creating a more dynamic learning environment.
Figure 15:
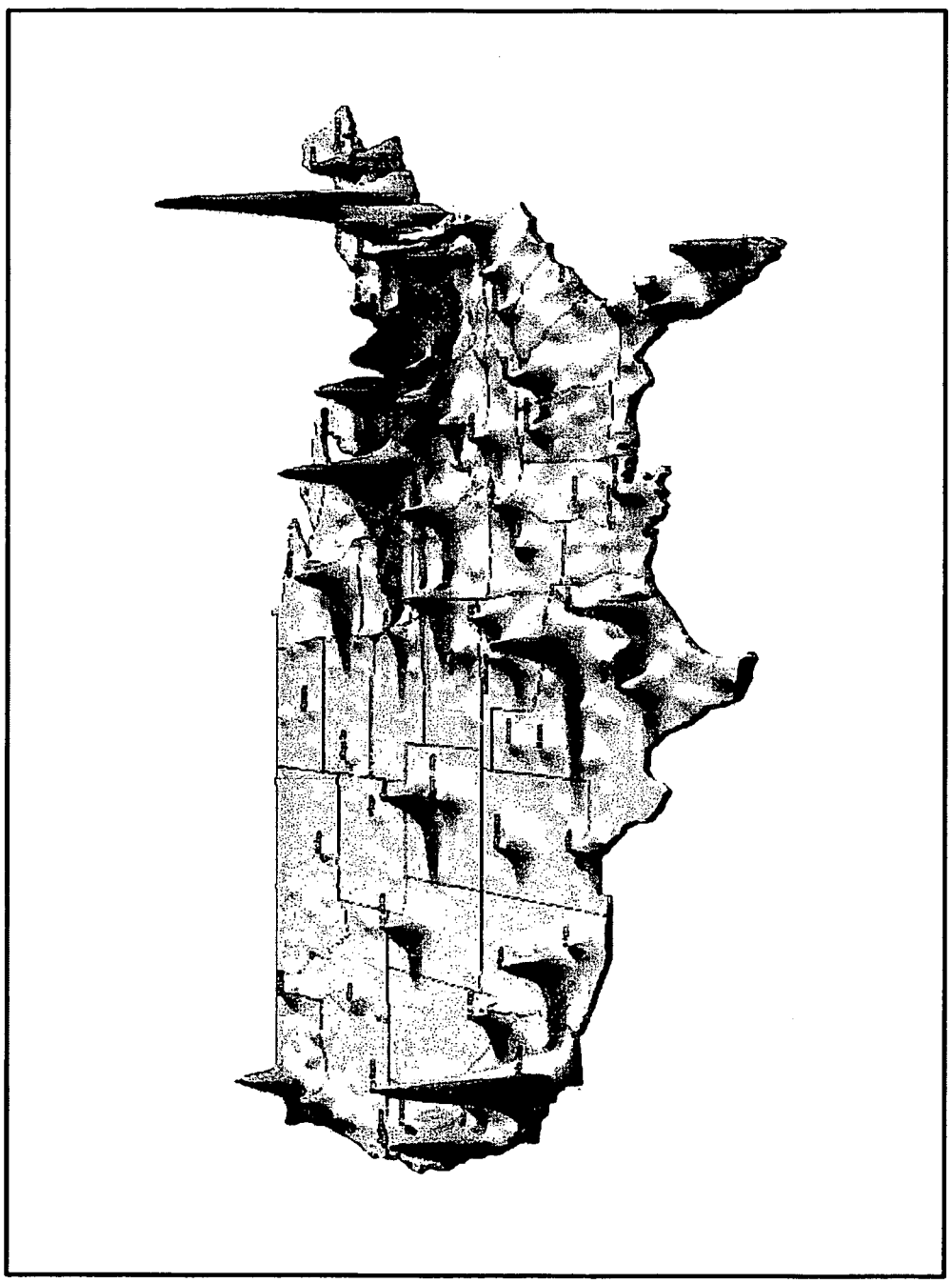
FIG. 15 illustrates a conventional visualization comparing population density, that the principles of the present invention may apply to thereby creating a more dynamic learning environment.

In domains like science, medicine, and demographics where complex data needs to be understood not just by domain practitioners but also the public, authors can used the principles described herein to create data visualizations that intrigue and engage the mass audience. They will use domain-specific metaphors, and impart the authors' sense of style. FIG. 14 is an illustration about children's education. FIG. 15 is a conventional illustration about population density. Conventionally, such visualizations are just static illustrations. With the principles described herein, these can become live, interactive experiences. For instance, by inputting a geographically distributed growth pattern as input data, a user might see the population peaks change. Some visualizations, where the authored model supports this, will let users do what-ifs. That is, the author may change some values and see the effect on that change on other values.

Accordingly, the principles described herein provide a major paradigm shift in the world of visualized problem solving and analysis. The paradigm shift applies across all domains as the principles described herein may apply to any domain.

Having described the embodiments in some detail, as a side-note, the various operations and structures described herein may, but need, not be implemented by way of a computing system. Accordingly, to conclude this description, an example computing system will be described with respect to FIG. 16.

Figure 16:
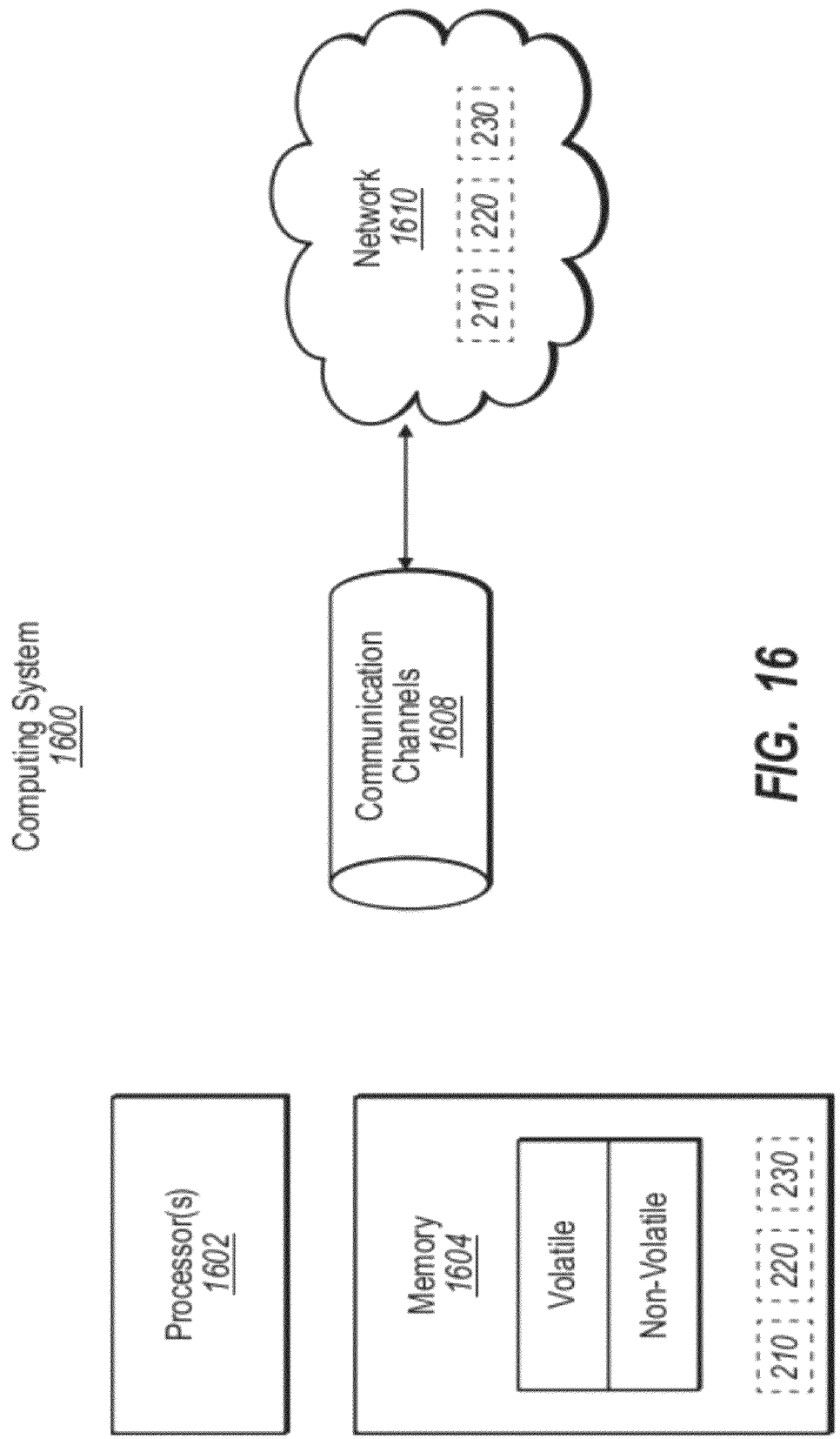
FIG. 16 illustrates a computing system that represents an environment in which the composition framework of FIG. 1 (or portions thereof) may be implemented.

FIG. 16 illustrates a computing system 1600. Computing systems are now increasingly taking a wide variety of forms. Computing systems may, for example, be handheld devices, appliances, laptop computers, desktop computers, mainframes, distributed computing systems, or even devices that have not conventionally considered a computing system. In this description and in the claims, the term "computing system" is defined broadly as including any device or system (or combination thereof) that includes at least one processor, and a memory capable of having thereon computer-executable instructions that may be executed by the processor. The memory may take any form and may depend on the nature and form of the computing system. A computing system may be distributed over a network environment and may include multiple constituent computing systems.

As illustrated in FIG. 16, in its most basic configuration, a computing system 1600 typically includes at least one processing unit 1602 and memory 1604. The memory 1604 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well. As used herein, the term "module" or "component" can refer to software objects or routines that execute on the computing system. The different components, modules, engines, and services described herein may be implemented as objects or processes that execute on the computing system (e.g., as separate threads).

In the description that follows, embodiments are described with reference to acts that are performed by one or more computing systems. If such acts are implemented in software, one or more processors of the associated computing system that performs the act direct the operation of the computing system in response to having executed computer-executable instructions. An example of such an operation involves the manipulation of data. The computer-executable instructions (and the manipulated data) may be stored in the memory 1604 of the computing system 1600.

Computing system 1600 may also contain communication channels 1608 that allow the computing system 1600 to communicate with other message processors over, for example, network 1610. Communication channels 1608 are examples of communications media. Communications media typically embody computer-readable instructions, data structures, program modules, or other data in a modulated data signal such as a carrier wave or other transport mechanism and include any information-delivery media. By way of example, and not limitation, communications media include wired media, such as wired networks and direct-wired connections, and wireless media such as acoustic, radio, infrared, and other wireless media. The term computer-readable media as used herein includes both storage media and communications media.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, implemented at a computer system that includes one or more processors, for analytically constructing an interactive map view comprising a plurality of visual map items, the method comprising:

an act of the computer system accessing input data that at least collectively affects what visual map items are displayed in a virtual display space corresponding to a map view, and how and where the visual map items are displayed in the virtual display space relative to one another, when rendered, the visual map items including at least a first visual map item and a second visual map item, wherein a location of the second visual map item in the virtual display space is constrained by a location of the first visual map item in the virtual display space;

an act of the computer system identifying an analytical model corresponding to the map view, the analytical model defining analytical relations between a plurality of model parameters related to rendering the visual map items;

an act of the computer system binding the input data to at least a first model parameter of the plurality of model parameters, thereby defining the first model parameter as an input to the analytical model, the first model parameter affecting at least where the first visual map item is rendered in the virtual display space;

an act of the computer system determining that at least a second model parameter of the plurality of model parameters is to be solved for as an output of the analytical model, the second model parameter affecting at least where the second visual map item is rendered in the virtual display space;

an act of the computer system solving for the plurality of model parameters, including solving for the second model parameter based on one or more values of the input data supplied to the first model parameter and based on the analytical relations, including executing a constraints solver to determine at least one constraint on a solved value of the second model parameter, the at least one constraint based on one or more properties of the second visual map item that restrict the location of the second visual map item relative to the first visual map item;

an act of the computer system binding at least the first and second model parameters to corresponding map view components, each map view component affecting how and where one or more of the visual map items are rendered, including binding the first model parameter to a first map view component corresponding to the first visual map item, and binding the second model parameter to a second map view component corresponding to the second visual map item;

an act of the computer system generating a first view composition of the visual map items by rendering the first visual map item at a first location in the virtual display space and rendering the second visual map item at a second location in the virtual display space that is different from the first location based on the first and second map view components and based on the first and second model parameters;

an act of receiving user input changing the binding of the plurality of model parameters, so that the first model parameter becomes an output of the analytical model and so that the second model parameter becomes an input to the analytical model;

an act of the computer system receiving user input, via a visual manipulation of the second visual map item at the virtual display space, that provides an input value for the second model parameter and that changes the location of the second visual map item in the virtual display space to a third location that is different from the second location;

an act of the computer system calculating a plurality of values for the first model parameter based on the input value for the second model parameter received from the user input and based on the analytical relations, the plurality of values for the first model parameter adhering to the at least one constraint that restricts the location of the second visual map item relative to the first visual map item; and an act of the computer system generating a second view composition of the visual map items, including rendering the second visual man item at the third location and indicating a plurality of possible locations for the first visual map item based on the calculated plurality of values for the first model parameter.

2. A method for analytically constructing an interactive map view in accordance with claim 1, wherein the identity of the plurality of model parameters, and the analytical relationships between the plurality of model parameters may be declaratively defined.

3. A method for analytically constructing an interactive map view in accordance with claim 2, wherein the analytical relationships between the plurality of model parameters comprise an expression that includes at least one equation.

4. A method for analytically constructing an interactive map view in accordance with claim 2, wherein the analytical relationships between the plurality of model parameters comprise an expression that includes at least one rule.

5. A method for analytically constructing an interactive map view in accordance with claim 2, wherein the analytical relationships between the plurality of model parameters comprise an expression that includes at least one constraint.

6. A method for analytically constructing an interactive map view in accordance with claim 1, wherein the identity of model parameters that are inputs and the identity of model parameters that are outputs may change from one solve iteration to the next.

7. A method for analytically constructing an interactive map view in accordance with claim 1, wherein the act of solving for the plurality of model parameters comprises:
  an act of the computer system coordinating the solving operations of multiple heterogenic solvers.

8. A computer program product comprising one or more physical computer storage devices having stored thereon one or more stored computer-executable instruction(s) that, when executed by one or more processors of a computing system, cause the computing system to perform a method comprising:
  an act of accessing input data that at least collectively affects what visual map items are displayed in a virtual display space corresponding to a map view, and how and where of the visual map items are displayed in the virtual display space relative to one another, when rendered, the visual map items including at least a first visual map item and a second visual map item, wherein a location of the second visual map item in the virtual display space is constrained by a location of the first visual map item in the virtual display space;
  an act of identifying an analytical model corresponding to the map view, the analytical model defining analytical relations between a plurality of model parameters related to rendering the visual man items;
  an act of binding the input data to at least a first model parameter of the plurality of model parameters, thereby defining the first model parameter as an input to the analytical model, the first model parameter affecting at least where the first visual map item is rendered in the virtual display space;
  an act of determining that at least a second model parameter of the plurality of model parameters is to be solved for as an output of the analytical model, the second model parameter affecting at least where the second visual map item is rendered in the virtual display space;
  an act of solving for the plurality of model parameters, including solving for the second model parameter based on one or more values of the input data supplied to the first model parameter and based on the analytical relations, including executing a constraints solver to determine at least one constraint on a solved value of the second model parameter, the at least one constraint based on one or more properties of the second visual map item that restrict the location of the second visual map item relative to the first visual map item;
  an act of binding at least the first and second model parameters to corresponding map view components, each map view component affecting how one or more of the visual map items are rendered, including binding the first model parameter to a first map view component corresponding to the first visual map item, and binding the second model parameter to a second map view component corresponding to the second visual map item;
  an act of generating a first view composition of the visual map items by rendering the first visual map item at a first location in the virtual display space and rendering the second visual map items-item at a second location in the virtual display space that is different from the first location based on the first and second map view components and based on the first and second model parameters;
  an act of inverting the binding of the plurality of model parameters, so that the first model parameter becomes an output of the analytical model and so that the second model parameter becomes an input to the analytical model;
  an act of receiving user input, via a visual manipulation of the second visual map item at the virtual display space, that supplies an input value for the second model parameter and that changes the location of the second visual map item in the virtual display space to a third location that is different from the second location;
  an act of generating a plurality of values for the first model parameter based on the input value for the second model parameter received from the user input and based on the analytical relations, the plurality of values of the first model parameter adhering to the at least one constraint that restricts the location of the second visual map item relative to the first visual map item; and
  an act of generating a second view composition of the visual map items, including rendering the second visual map item at the third location and indicating a plurality of possible locations for the first visual map item based on the calculated plurality of values for the first model parameter.

9. A computer program product in accordance with claim 8, wherein the map view is a view of a city.

10. A computer program product in accordance with claim 8, wherein the map view is a view of a geographical location.

11. A computer program product in accordance with claim 8, wherein the map view is of a three-dimensional volume.

12. A computer program product in accordance with claim 11, wherein the map view has a coordinate system, the coordinate system selected from the group consisting of Cartesian coordinates, polar coordinates, logarithmic coordinates, and a coordinate system in which space may be stretched in way that is captured or represented via arbitrary mathematical equations.

13. A computer program product as recited in claim 8, wherein the one or more computer-executable instruction(s), when executed by the one or more processors of the computing system, cause the computing system to further use:
  a data access component to access heterogenic data that drives construction of the composite view of visual items;
  a data canonicalization component to present the heterogenic input data in a canonicalized format;
  a data-model binding component to bind portions of the canonicalized data from the data canonicalization component to the corresponding map model parameters.

14. A computer program product in accordance with claim 13, wherein the computer-executable instruction(s), when executed by the one or more processors of the computing system, cause the computing system to regenerate the composite map view of visual map items in response to user manipulation of the composite map view of visual map items.

15. A method for analytically constructing an interactive map view in accordance with claim 1, further comprising:
an act of the computer system displaying the first view composition and the second view composition, the visual map items also including at least one comparison element that visually represents a comparison of corresponding values of at least one parameter across the at least two different view compositions, wherein the at least one comparison element is displayed with each of the at least two different view compositions.

16. A method for analytically constructing an interactive map view in accordance with claim 15, wherein the at least two different view compositions are displayed simultaneously.

17. A method for analytically constructing an interactive map view in accordance with claim 1, wherein the method further includes an act of the computer system prompting a user to selectively move the second visual item to maximize the value of the second model parameter.

18. A method for analytically constructing an interactive map view in accordance with claim 1, wherein the analytical relations comprise: one or more equations, one or more rules, and one or more constraints that define relationships between the plurality of model parameters.

19. A method for analytically constructing an interactive map view in accordance with claim 18, wherein the act of the computer system solving for the plurality of model parameters, including solving for the second model parameter based on one or more values of the input data supplied to the first model parameter and based on the analytical relations, includes performing, in order, the following:
executing the constraints solver to determine at least one constraint on the solved value of the second model parameter; and
based on the solved at least one constraint, executing an equations solver and a rules solver to solve the one or more equations and the one or more rules of the analytical relations to determine at least one value of the second model parameter that adheres to the at least one constraint.

20. A method for analytically constructing an interactive map view in accordance with claim 18, wherein the act of the computer system solving for the plurality of model parameters, including solving for the second model parameter based on one or more values of the input data supplied to the first model parameter and based on the analytical relations, includes performing, in order, the following to determine at least one value of the second model parameter that adheres to the at least one constraint on the second model parameter:
executing the constraints solver to determine at least one constraint on the solved value of the second model parameter;
based on the solved at least one constraint, executing an equations solver to solve the one or more equations of the analytical relations; and
based on the solved at least one constraint and the solved one or more equations, executing a rules solver to solve the one or more rules of the analytical relations.

21. A method for analytically constructing an interactive map view in accordance with claim 1, wherein the at least one constraint based on one or more properties of the second visual map item comprises a zoning restriction on the second visual map item.

22. A method for analytically constructing an interactive map view in accordance with claim 1, wherein the second visual map item comprises a house element, and wherein the at least one constraint based on one or more properties of the second visual map item comprises a restriction on placement of the house element relative to the first visual map item based on a zoning designation.

23. A computer system, comprising:
one or more processors; and
one or more computer storage devices having stored thereon computer-executable instructions which, when executed at the one or more processors, implement a method for analytically constructing an interactive map view comprising a plurality of visual map items, the method comprising:
accessing input data that at least collectively affects what visual map items are displayed in a virtual display space corresponding to a map view, and how and where the visual map items are displayed in the virtual display space relative to one another, when rendered, the visual map items including at least a first visual map item and a second visual map item, wherein a location of the second visual map item in the virtual display space is constrained by a location of the first visual map item in the virtual display space;
identifying an analytical model corresponding to the map view, the analytical model defining analytical relations between a plurality of model parameters related to rendering the visual map items;
binding the input data to at least a first model parameter of the plurality of model parameters, thereby defining the first model parameter as an input to the analytical model, the first model parameter affecting at least where the first visual map item is rendered in the virtual display space;
determining that at least a second model parameter of the plurality of model parameters is to be solved for as an output of the analytical model, the second model parameter affecting at least where the second visual map item is rendered in the virtual display space;
solving for the plurality of model parameters, including solving for the second model parameter based on one or more values of the input data supplied to the first model parameter and based on the analytical relations, including executing a constraints solver to determine at least one constraint on a solved value of the second model parameter, the at least one constraint based on one or more properties of the second visual map item that restrict the location of the second visual map item relative to the first visual map item;
binding at least the first and second model parameters to corresponding map view components, each map view component affecting how and where one or more of the visual map items are rendered, including binding the first model parameter to a first map view component corresponding to the first visual map item, and binding the second model parameter to a second map view component corresponding to the second visual map item;
generating a first view composition of the visual map items by rendering the first visual map item at a first location in the virtual display space and rendering the second visual map item at a second location in the virtual display space that is different from the first location based on the first and second map view components and based on the first and second model parameters;

receiving user input changing the binding of the plurality of model parameters, so that the first model parameter becomes an output of the analytical model and so that the second model parameter becomes an input to the analytical model;

receiving user input, via a visual manipulation of the second visual map item at the virtual display space, that provides an input value for the second model parameter and that changes the location of the second visual map item in the virtual display space to a third location that is different from the second location;

calculating a plurality of values for the first model parameter based on the input value for the second model parameter received from the user input and based on the analytical relations, the plurality of values for the first model parameter adhering to the at least one constraint that restricts the location of the second visual map item relative to the first visual map item; and generating a second view composition of the visual map items, including rendering the second visual map item at the third location and indicating a plurality of possible locations for the first visual map item based on the calculated plurality of values for the first model parameter.

* * * * *